United States Patent
Yeh et al.

(10) Patent No.: US 8,116,063 B2
(45) Date of Patent: Feb. 14, 2012

(54) SEMICONDUCTOR CAPACITOR STRUCTURE AND LAYOUT PATTERN THEREOF

(75) Inventors: Ta-Hsun Yeh, Hsin-Chu (TW); Han-Chang Kang, Taipei Hsien (TW)

(73) Assignee: Realtek Semiconductor Corp., Hsinchu (TW)

( * ) Notice: Subject to any disclaimer, the term of this patent is extended or adjusted under 35 U.S.C. 154(b) by 720 days.

(21) Appl. No.: 12/248,034

(22) Filed: Oct. 8, 2008

(65) Prior Publication Data
US 2009/0091875 A1    Apr. 9, 2009

(30) Foreign Application Priority Data
Oct. 9, 2007   (TW) .............................. 96137824 A

(51) Int. Cl.
H01G 4/005 (2006.01)
H01G 4/06 (2006.01)
H01G 4/38 (2006.01)
H01L 27/108 (2006.01)
H01L 29/94 (2006.01)

(52) U.S. Cl. ......... 361/303; 361/311; 361/328; 257/307
(58) Field of Classification Search .................. 361/303, 361/304, 305, 311, 307, 313, 328, 329, 33; 257/307

See application file for complete search history.

(56) References Cited

U.S. PATENT DOCUMENTS

| | | | |
|---|---|---|---|
| 6,625,006 B1 | 9/2003 | Aram et al. | |
| 6,784,050 B1 | 8/2004 | Sutardja et al. | |
| 6,819,542 B2 | 11/2004 | Tsai et al. | |
| 6,885,543 B1 | 4/2005 | Aram et al. | |
| 6,974,744 B1 | 12/2005 | Aram et al. | |
| 7,327,555 B2 | 2/2008 | Yeh et al. | |
| 7,545,022 B2* | 6/2009 | Chen et al. | 257/532 |
| 2004/0031982 A1 | 2/2004 | Devries | |
| 2007/0126078 A1* | 6/2007 | Huang et al. | 257/532 |
| 2007/0235838 A1 | 10/2007 | Wang | |
| 2007/0291439 A1 | 12/2007 | Yeh | |
| 2007/0296013 A1* | 12/2007 | Chang et al. | 257/306 |
| 2008/0012092 A1* | 1/2008 | Liang et al. | 257/532 |
| 2008/0158772 A1* | 7/2008 | Hsien et al. | 361/306.3 |
| 2008/0237792 A1 | 10/2008 | Kang et al. | |

FOREIGN PATENT DOCUMENTS

| | | |
|---|---|---|
| CN | 101047209 A | 10/2007 |
| TW | I222089 | 10/2004 |
| TW | 200608509 | 3/2006 |
| TW | 200729456 | 8/2007 |

* cited by examiner

Primary Examiner — Eric Thomas
Assistant Examiner — David M Sinclair
(74) Attorney, Agent, or Firm — Thomas, Kayden, Horstemeyer & Risley, LLP

(57) ABSTRACT

The present invention provides a metal-oxide-metal (MOM) capacitor structure composed of a first capacitor and a second capacitor. The MOM capacitor structure has a plurality of symmetrical branch sections, which form an interdigitated structure along a plurality of ring contours. The MOM capacitor structure has an optimal geometrical symmetry, and therefore a better capacitance matching effect can be obtained, and the MOM capacitor structure has a higher unit capacitance. In addition, a capacitance value ratio between the first capacitor and the second capacitor can be adjusted according to different requirements in the MOM capacitor structure. Furthermore, the MOM capacitor structure of the present invention does not need additional masks, and the process cost is cheaper. In addition, due to the semiconductor process improvement, a large amount of metal layers can be stacked, and since the distance between the metal layers becomes smaller, the unit capacitance becomes higher.

28 Claims, 16 Drawing Sheets

SEMICONDUCTOR CAPACITOR STRUCTURE AND LAYOUT PATTERN THEREOF

BACKGROUND OF THE INVENTION

1. Field of the Invention

The present invention relates to a semiconductor capacitor structure, and more particularly, to a metal-oxide-metal (MOM) type capacitor structure composed of a first capacitor and a second capacitor, which has a plurality of symmetrical branch sections forming an interdigitated structure along a plurality of ring contours. The semiconductor capacitor structure has an optimal geometrical symmetry, and thus a better capacitance matching effect and a higher unit capacitance. In addition, a capacitance value ratio between the first capacitor and the second capacitor in the MOM capacitor structure can be adjusted according to varied requirements.

2. Description of the Prior Art

In semiconductor manufacturing processes, metal capacitors constituted by metal-insulator-metal (MIM) capacitor structures are widely applied in Ultra Large Scale Integration (ULSI) designs. Due to their lower resistance, less significant parasitic effect, and absence of induced voltage shift in the depletion region, metal capacitors with MIM capacitor structure are usually adopted as the main choice of semiconductor capacitor designs.

However, since the manufacturing cost for the MIM capacitor structure is very expensive mainly due to the additional mask(s) required in its manufacturing process, and as the cost becomes more significant along with progress of advanced semiconductor manufacturing process technologies, an interdigitated metal capacitor which only requires the metal-oxide-metal (MOM) capacitor structure in the standard CMOS manufacturing process has been developed in accordance with a requirement for a more economical semiconductor manufacturing process technology. Applications of interdigitated metal capacitors have already been disclosed and discussed in various literature, such as U.S. Pat. No. 6,784,050, U.S. Pat. No. 6,885,543, U.S. Pat. No. 6,974,744, U.S. Pat. No. 6,819,542, and Taiwan Patent No. 222,089 (the Taiwan counterpart patent of U.S. Pat. No. 6,819,542), whose contents are incorporated herein by reference.

In addition, because the layout mismatch of a semiconductor capacitor structure is inversely proportional to the square root of a capacitance value of the semiconductor capacitor structure, conventionally a common centroid type layout topology is utilized to form the layout of the semiconductor capacitor structure, for improving the matching performance (i.e., geometrical symmetry) of the layout of the semiconductor capacitor structure, so as to increase the capacitance value of the semiconductor capacitor structure. One can find such a layout topology as shown in FIG. 1, wherein the semiconductor capacitor structure includes a first capacitor C1 and a second capacitor C2.

A multi-common centroid type layout topology is further utilized in the conventional art to form the layout of the semiconductor capacitor structure, for improving such a common centroid type layout topology, so as to reduce the negative effects caused by semiconductor process variation to geometrical symmetry of the layout of the semiconductor capacitor structure. One can find such an improved layout topology as shown in FIG. 2, wherein the semiconductor capacitor structure also includes a first capacitor C1 and a second capacitor C2. Such a multi-common centroid type layout topology, however, increases layout complexity.

However, no matter which of the common centroid type layout topology shown in FIG. 1 and the multi-common centroid type layout topology shown in FIG. 2 is adopted, the capacitance value ratio of the first capacitor C1 and the second capacitor C2 in the semiconductor capacitor structure can only be set at 1:1. However, since there are situations where an application may require a semiconductor capacitor structure with the first capacitor C1 and the second capacitor C2 having capacitance value ratio other than 1:1, while the semiconductor capacitor structure is also required to have the optimal geometrical symmetry and maximum unit capacitance, the aforementioned conventional arts cannot fully address such a contemporary need.

SUMMARY OF THE INVENTION

It is therefore one of the objectives of the present invention to provide a semiconductor capacitor structure composed of a first capacitor and a second capacitor, which has a plurality of symmetrical branch sections forming an interdigitated structure along a plurality of ring contours. The semiconductor capacitor structure has optimized geometrical symmetry, thus a better capacitance matching characteristic can be obtained and the MOM capacitor structure has a higher unit capacitance. In addition, a capacitance value ratio between the first capacitor and the second capacitor can be adjusted according to various requirements in the MOM capacitor structure.

In accordance with an embodiment of the present invention, a semiconductor capacitor structure composed of a first capacitor and a second capacitor is disclosed. The semiconductor capacitor structure includes a first metal layer, and the first metal layer includes: a plurality of first branch sections parallel to one another, a plurality of second branch sections parallel to one another, a first section, a plurality of third branch sections parallel to one another, a plurality of fourth branch sections parallel to one another, a plurality of fifth branch sections parallel to one another, a plurality of sixth branch sections parallel to one another, a plurality of seventh branch sections parallel to one another, a plurality of eighth branch sections parallel to one another, a second section, a third section, a plurality of ninth branch sections parallel to one another, a plurality of tenth branch sections parallel to one another, a plurality of eleventh branch sections parallel to one another, a plurality of twelfth branch sections parallel to one another, a fourth section, a fifth section, a plurality of thirteenth branch sections parallel to one another, a plurality of fourteenth branch sections parallel to one another, a plurality of fifteenth branch sections parallel to one another, a plurality of sixteenth branch sections parallel to one another, a sixth section, a seventh section, and an eighth section. The first section is coupled to the plurality of first branch sections and the plurality of second branch sections. The plurality of second branch sections and the plurality of third branch sections interdigitate with each other in parallel, and the plurality of first branch sections and the plurality of fourth branch sections interdigitate with each other in parallel. The plurality of sixth branch sections and the plurality of seventh branch sections interdigitate with each other in parallel, and the plurality of fifth branch sections and the plurality of eighth branch sections interdigitate with each other in parallel. The second section is coupled to the plurality of third branch sections and the plurality of eighth branch sections. The third section is coupled to the plurality of fifth branch sections and the plurality of sixth branch sections. The plurality of tenth branch sections and the plurality of eleventh branch sections interdigitate with each other in parallel, and the plurality of ninth branch sections and the plurality of twelfth branch sections interdigitate with each other in parallel. The fourth section is coupled to the plurality of seventh branch sections and the plurality of twelfth branch sections. The fifth section is coupled to the plurality of ninth branch sections and the plurality of tenth branch sections. The plurality of fourteenth branch sections and the plurality of fifteenth branch sections interdigitate with each other in parallel, and the plurality of thirteenth branch sections and the plurality of sixteenth branch sections interdigitate with each other in parallel. The sixth section is coupled to the plurality of eleventh branch sections and the plurality of sixteenth branch sections. The seventh section is coupled to the plurality of thirteenth branch sections and the plurality of fourteenth branch sections. The eighth section is coupled to the plurality of fifteenth branch sections and the plurality of fourth branch sections. In addition, the first section, the plurality of first branch sections, the plurality of second branch sections, the fifth section, the plurality of ninth branch sections, and the plurality of tenth branch sections make up a portion of a first electrode of the first capacitor. The third section, the plurality of fifth branch sections, the plurality of sixth branch sections, the seventh section, the plurality of thirteenth branch sections, and the plurality of fourteenth branch sections make up a portion of a first electrode of the second capacitor. The second section, the plurality of third branch sections, the plurality of eighth branch sections, the fourth section, the plurality of seventh branch sections, the plurality of twelfth branch sections, the sixth section, the plurality of eleventh branch sections, the plurality of sixteenth branch sections, the eighth section, the plurality of fifteenth branch sections, and the plurality of fourth branch sections make up a portion of a common second electrode of the first capacitor and the second capacitor.

In accordance with an embodiment of the present invention, a semiconductor capacitor structure composed of a first capacitor and a second capacitor is further disclosed. The semiconductor capacitor structure includes a first metal layer, and the first metal layer includes: a plurality of first branch sections parallel to one another, a plurality of second branch sections parallel to one another, a first section, a plurality of third branch sections parallel to one another, a plurality of fourth branch sections parallel to one another, a second section, a plurality of fifth branch sections parallel to one another, a plurality of sixth branch sections parallel to one another, a third section, a plurality of seventh branch sections parallel to one another, a plurality of eighth branch sections parallel to one another, a fourth section, a plurality of ninth branch sections parallel to one another, a plurality of tenth branch sections parallel to one another, a fifth section, a plurality of eleventh branch sections parallel to one another, a plurality of twelfth branch sections parallel to one another, a sixth section, a plurality of thirteenth branch sections parallel to one another, a plurality of fourteenth branch sections parallel to one another, a seventh section, a plurality of fifteenth branch sections parallel to one another, a plurality of sixteenth branch sections parallel to one another, and an eighth section. The first section is coupled to the plurality of first branch sections and the plurality of second branch sections. The plurality of second branch sections and the plurality of third branch sections interdigitate with each other in parallel, and the plurality of first branch sections and the plurality of fourth branch sections interdigitate with each other in parallel. The second section is coupled to the plurality of third branch sections and the plurality of fourth branch sections, and the second section has a first included angle. The third section is coupled to the plurality of fifth branch sections and the plurality of sixth branch sections. The plurality of sixth branch sections and the plurality of seventh branch sections inter-digitate with each other in parallel, and the plurality of fifth branch sections and the plurality of eighth branch sections interdigitate with each other in parallel. The fourth section is coupled to the plurality of seventh branch sections and the plurality of eighth branch sections, and the fourth section has a second included angle. The fifth section is coupled to the plurality of ninth branch sections and the plurality of tenth branch sections. The plurality of tenth branch sections and the plurality of eleventh branch sections interdigitate with each other in parallel, and the plurality of ninth branch sections and the plurality of twelfth branch sections interdigitate with each other in parallel. The sixth section is coupled to the plurality of eleventh branch sections and the plurality of twelfth branch sections, and the sixth section has a third included angle. The seventh section is coupled to the plurality of thirteenth branch sections and the plurality of fourteenth branch sections. The plurality of fourteenth branch sections and the plurality of fifteenth branch sections interdigitate with each other in parallel, and the plurality of thirteenth branch sections and the plurality of sixteenth branch sections interdigitate with each other in parallel. The eighth section is coupled to the plurality of fifteenth branch sections and the plurality of sixteenth branch sections, and the eighth section has a fourth included angle. In addition, the first section, the plurality of first branch sections, the plurality of second branch sections, the fifth section, the plurality of ninth branch sections, and the plurality of tenth branch sections make up a portion of a first electrode of the first capacitor. The second section, the plurality of third branch sections, the plurality of fourth branch sections, the sixth section, the plurality of eleventh branch sections, and the plurality of twelfth branch sections make up a portion of a second electrode of the first capacitor. The third section, the plurality of fifth branch sections, the plurality of sixth branch sections, the seventh section, the plurality of thirteenth branch sections, the plurality of fourteenth branch sections make up a portion of a first electrode of the second capacitor; and the fourth section, the plurality of seventh branch sections, the plurality of eighth branch sections, the eighth section, the plurality of fifteenth branch sections, and the plurality of sixteenth branch sections make up a portion of a second electrode of the second capacitor.

In accordance with an embodiment of the present invention, a semiconductor capacitor structure is yet further disclosed. The semiconductor capacitor structure is formed in at least a first metal layer, and includes a first capacitor and a second capacitor. The semiconductor capacitor structure in the first metal layer includes: a plurality of first branch sections parallel to one another, making up a portion of a first electrode of the first capacitor; a plurality of second branch sections parallel to one another, making up a portion of the first electrode of the first capacitor; a plurality of third branch sections parallel to one another, interdigitating with the plurality of second branch sections in parallel to make up a portion of capacitance effect of the first capacitor; a plurality of fourth branch sections parallel to one another, interdigitating with the plurality of first branch sections in parallel to make up a portion of capacitance effect of the first capacitor; a plurality of fifth branch sections parallel to one another, making up a portion of a first electrode of the second capacitor; a plurality of sixth branch sections parallel to one another, making up a portion of the first electrode of the second capacitor; a plurality of seventh branch sections parallel to one another, interdigitating with the plurality of sixth branch sections in parallel to make up a portion of capacitance effect of the second capacitor; a plurality of eighth branch sections parallel to one another, interdigitating with the plurality of fifth branch sections in parallel to make up a portion of capacitance effect of the second capacitor; a plurality of ninth branch sections parallel to one another, making up a portion of the first electrode of the first capacitor; a plurality of tenth branch sections parallel to one another, making up a portion of the first electrode of the first capacitor; a plurality of eleventh branch sections parallel to one another, interdigitating with the plurality of tenth branch sections in parallel to make up a portion of capacitance effect of the first capacitor; a plurality of twelfth branch sections parallel to one another, interdigitating with the plurality of ninth branch sections in parallel to make up a portion of capacitance effect of the first capacitor; a plurality of thirteenth branch sections parallel to one another, making up a portion of the first electrode of the second capacitor; a plurality of fourteenth branch sections parallel to one another, making up a portion of the first electrode of the second capacitor; a plurality of fifteenth branch sections parallel to one another, interdigitating with the plurality of fourteenth branch sections in parallel to make up a portion of capacitance effect of the second capacitor; a plurality of sixteenth branch sections parallel to one another, interdigitating with the plurality of thirteenth branch sections in parallel to make up a portion of capacitance effect of the second capacitor; wherein the plurality of first branch sections, the plurality of second branch sections, the plurality of third branch sections, the plurality of fourth branch sections, the plurality of fifth branch sections, the plurality of sixth branch sections, the plurality of seventh branch sections, the plurality of eighth branch sections, the plurality of ninth branch sections, the plurality of tenth branch sections, and the plurality of eleventh branch sections, the plurality of twelfth branch sections, the plurality of thirteenth branch sections, the plurality of fourteenth branch sections, the plurality of fifteenth branch sections, and the plurality of sixteenth branch sections are disposed along a plurality of closed contours parallel to one another.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and the claims to refer to particular system components. As one skilled in the art will appreciate, manufacturers may refer to a component by different names. This document does not intend to distinguish between components that differ in name but not function. In the following discussion and in the claims, the terms "include", "including", "comprise", and "comprising" are used in an open-ended fashion, and thus should be interpreted to mean "including, but not limited to . . . ." The terms "couple" and "coupled" are intended to mean either an indirect or a direct electrical connection. Thus, if a first device couples to a second device, that connection may be through a direct electrical connection, or through an indirect electrical connection via other devices and connections.

The semiconductor capacitor structures described in the embodiments of the present invention adopt the capacitor manufacturing technologies embodying metal-oxide-metal (MOM) capacitor structures that do not require additional process cost beyond the standard CMOS manufacturing process as a preferred realization scheme thereof. In other words, the capacitors in the embodiments of the present invention include metal layers as conductive material and insulator layers such as oxide layers as dielectric material. As will be appreciated by those of ordinary skill in the pertinent art, however, the realization of the core concept of the present invention is not necessarily limited to the disclosed embodiments as hereinafter described. Other known or novel conductive materials or dielectric materials can also be applied to implement the capacitor structure of the present invention.

Figure 1:
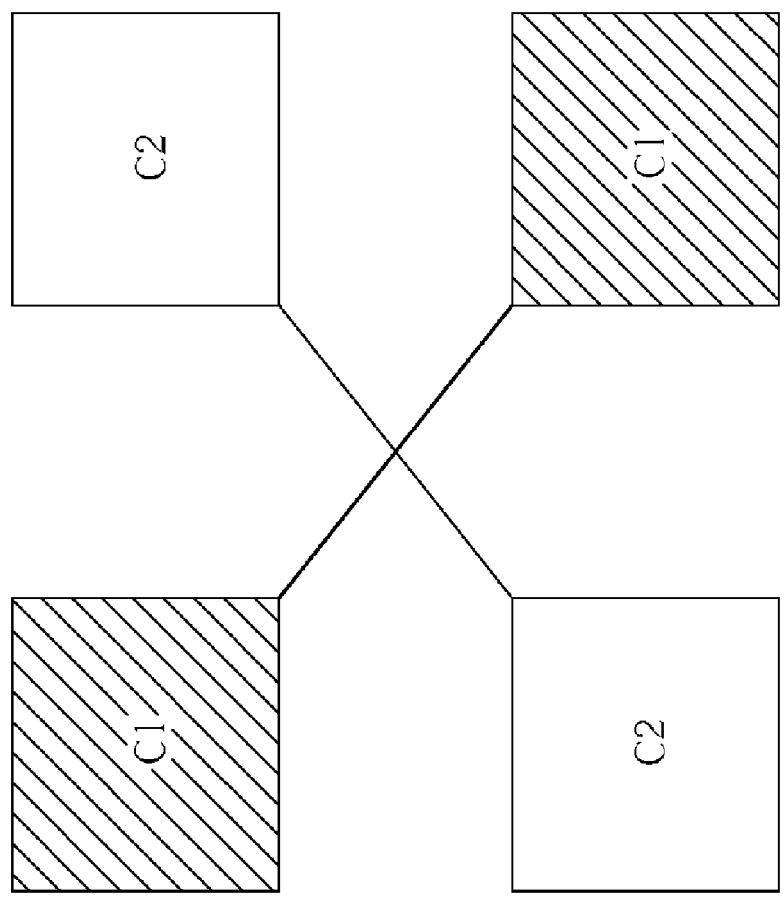
FIG. 1 is a top view schematic diagram of a layout of a conventional art semiconductor capacitor structure formed by utilizing a common centroid type layout topology.
Figure 2:
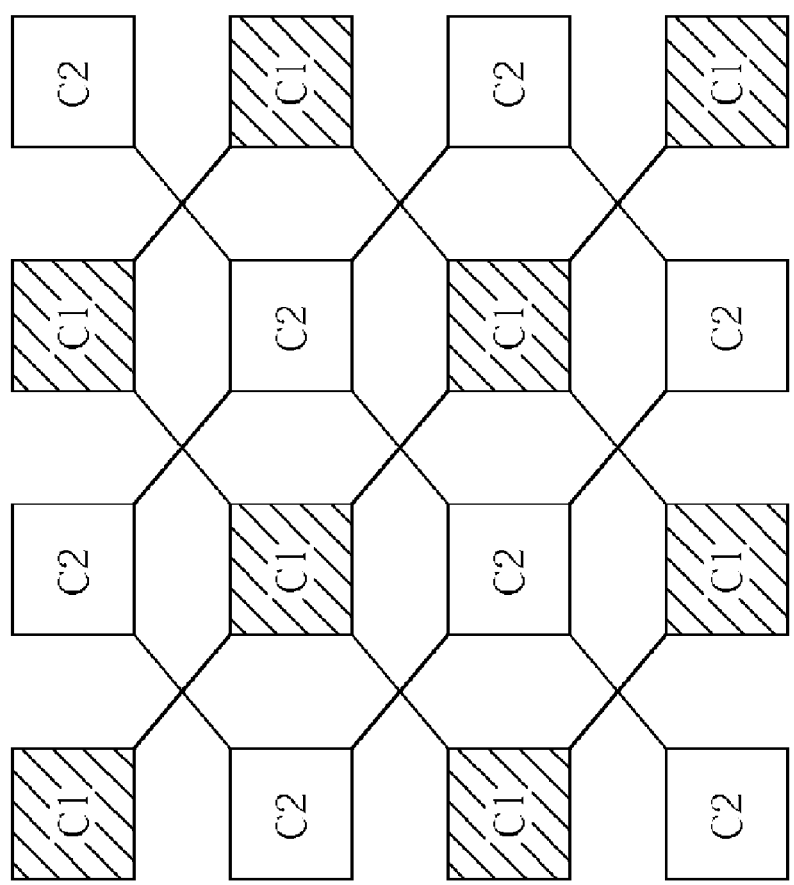
FIG. 2 is a top view schematic diagram of a layout of a conventional art semiconductor capacitor structure formed by utilizing a multi-common centroid type layout topology.
Figure 3:
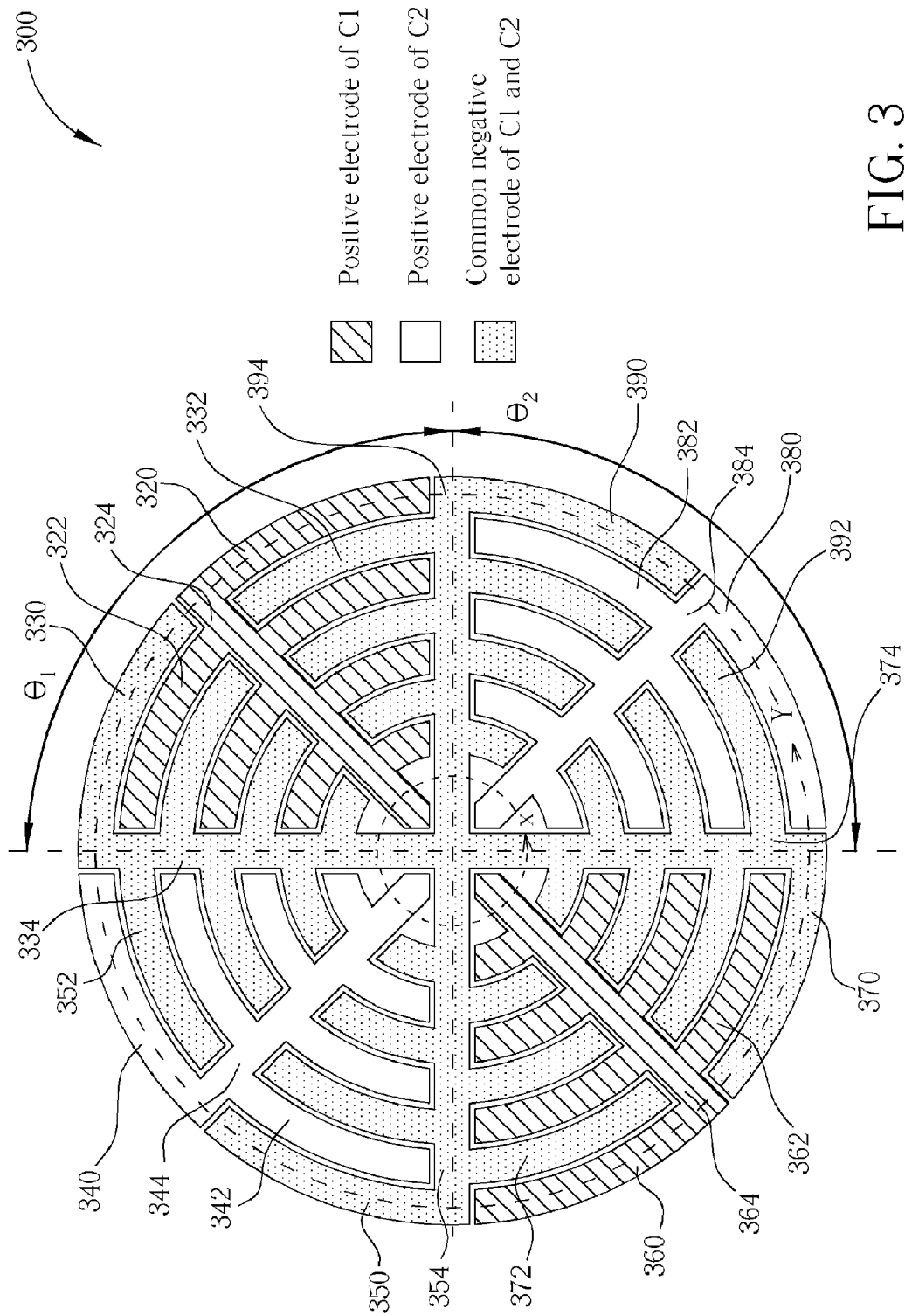
FIG. 3 is a top view schematic diagram of a first odd metal layer of a semiconductor capacitor structure in accordance with a first embodiment of the present invention.
Figure 4:
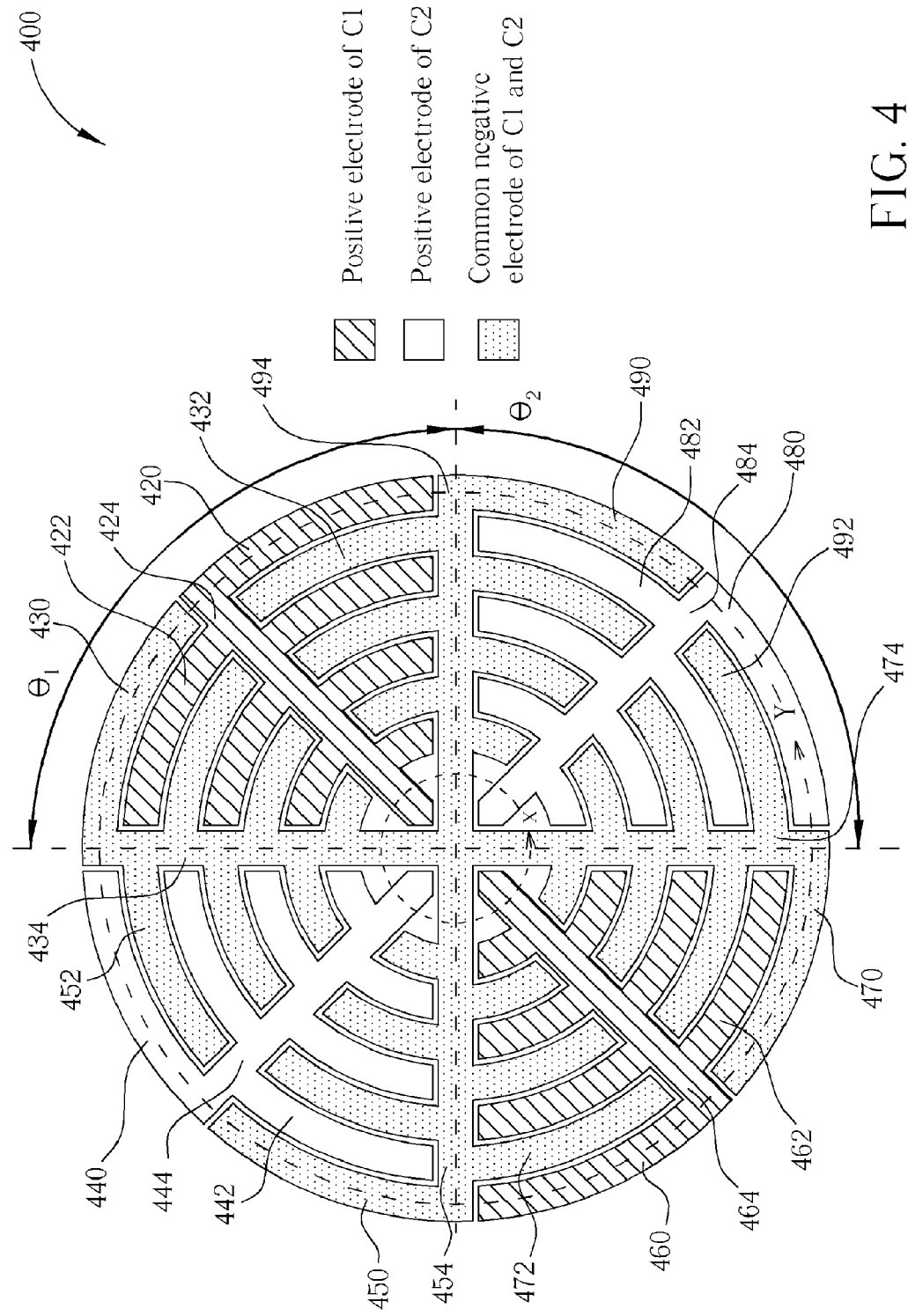
FIG. 4 is a top view schematic diagram of a first even metal layer of the semiconductor capacitor structure in accordance with the first embodiment of the present invention.

Please refer to FIG. 3 and FIG. 4 together. FIG. 3 is a top view schematic diagram of a first odd metal layer 300 of a semiconductor capacitor structure in accordance with a first embodiment of the present invention, and FIG. 4 is a top view schematic diagram of a first even metal layer 400 of said semiconductor capacitor structure, wherein the semiconductor capacitor structure includes a first capacitor C1 and a second capacitor C2. In general, the semiconductor capacitor structure in the first embodiment of the present invention is formed by interlacing and stacking a plurality of the first odd metal layers 300 shown in FIG. 3 and a plurality of the first even metal layers 400 shown in FIG. 4. In other words, a first even metal layer 400 is superimposed on top of a first odd metal layer 300, and another first odd metal layer 300 is further superimposed on top of the first even metal layer 400, and this scheme continues in the same way in order to form the semiconductor capacitor structure by interlacing and stacking a plurality of the first odd metal layers 300 and a plurality of the first even metal layers 400. In addition, an oxide layer is arranged as a dielectric layer between each pair of a first odd metal layers 300 and a adjacent first even metal layers 400. A person of average skill in the pertinent art should understand that a single first odd metal layer 300 and a single first even metal layer 400 are sufficient to form a semiconductor capacitor structure.

As shown in FIG. 3, the first odd metal layer 30 includes: a plurality of first branch sections 320 parallel to one another, a plurality of second branch sections 322 parallel to one another, a first section 324, a plurality of third branch sections 330 parallel to one another, a plurality of fourth branch sections 332 parallel to one another, a plurality of fifth branch sections 340 parallel to one another, a plurality of sixth branch sections 342 parallel to one another, a third section 344, a plurality of seventh branch sections 350 parallel to one another, a plurality of eighth branch sections 352 parallel to one another, a plurality of ninth branch sections 360 parallel to one another, a plurality of tenth branch sections 362 parallel to one another, a fifth section 364, a plurality of eleventh branch sections 370 parallel to one another, a plurality of twelfth branch sections 372 parallel to one another, a plurality of thirteenth branch sections 380 parallel to one another, a plurality of fourteenth branch sections 382 parallel to one another, a seventh section 384, a plurality of fifteenth branch sections 390 parallel to one another, a plurality of sixteenth branch sections 392 parallel to one another, a second section 334, a fourth section 354, a sixth section 374, and an eighth section 394.

The first section 324 is coupled to the plurality of first branch sections 320 and the plurality of second branch sections 322. The plurality of second branch sections 322 and the plurality of third branch sections 330 interdigitate with each other in parallel, and the plurality of first branch sections 320 and the plurality of fourth branch sections 332 interdigitate with each other in parallel. The third section 344 is coupled to the plurality of fifth branch sections 340 and the plurality of sixth branch sections 342. The plurality of sixth branch sections 342 and the plurality of seventh branch sections 350 interdigitate with each other in parallel, and the plurality of fifth branch sections 340 and the plurality of eighth branch sections 352 interdigitate with each other in parallel. The fifth section 364 is coupled to the plurality of ninth branch sections 360 and the plurality of tenth branch sections 362. The plurality of tenth branch sections 362 and the plurality of eleventh branch sections 370 interdigitate with each other in parallel, and the plurality of ninth branch sections 360 and the plurality of twelfth branch sections 372 interdigitate with each other in parallel. The seventh section 384 is coupled to the plurality of thirteenth branch sections 380 and the plurality of fourteenth branch sections 382. The plurality of fourteenth branch sections 382 and the plurality of fifteenth branch sections 390 interdigitate with each other in parallel, and the plurality of thirteenth branch sections 380 and the plurality of sixteenth branch sections 392 interdigitate with each other in parallel. Furthermore, the second section 334 is coupled to the plurality of third branch sections 330 and the plurality of eighth branch sections 352, the fourth section 354 is coupled to the plurality of seventh branch sections 350 and the plurality of twelfth branch sections 372, the sixth section 374 is coupled to the plurality of eleventh branch sections 370 and the plurality of sixteenth branch sections 392, and the eighth section 394 is coupled to the plurality of fifteenth branch sections 390 and the plurality of fourth branch sections 332. Finally, the second section 334, the fourth section 354, the sixth section 374, and the eighth section 394 are joined together and coupled to one another at the center point of the first odd metal layer 300 in the semiconductor capacitor structure.

Please note that the plurality of first branch sections 320, the plurality of third branch sections 330, the plurality of fifth branch sections 340, the plurality of seventh branch sections 350, the plurality of ninth branch sections 360, the plurality of eleventh branch sections 370, the plurality of thirteenth branch sections 380, and the plurality of fifteenth branch sections 390 develop along certain closed contour (be it a contour with turns, curves, or other shapes), and form a portion of a ring structure (such as a circular ring structure shown in FIG. 3). Similarly, the plurality of second branch sections 322, the plurality of fourth branch sections 332, the plurality of sixth branch sections 342, the plurality of eighth branch sections 352, the plurality of tenth branch sections 362, the plurality of fourteenth branch sections 382, and the plurality of sixteenth branch sections 392 also develop along certain closed contour (be it a contour with turns, curves, or other shapes), and form a portion of a ring structure (such as a circular ring structure shown in FIG. 3). A circular contour Y as shown in FIG. 3 provides an example of the above-mentioned contour, and it is clearly illustrated from the above description and the corresponding figures that each branch section mentioned above forms a portion of a plurality of ring structures along a plurality of concentric circular contours, as shown in FIG. 3.

In the first odd metal layer 300 of the semiconductor capacitor structure, the first section 324, the plurality of first branch sections 320, the plurality of second branch sections 322, the fifth section 364, the plurality of ninth branch sections 360, and the plurality of tenth branch sections 362 form a portion of a first electrode (such as a positive electrode) of the first capacitor C1 in the semiconductor capacitor structure of the first embodiment. The third section 344, the plurality of fifth branch sections 340, the plurality of sixth branch sections 342, the seventh section 384, the plurality of thirteenth branch sections 380, and the plurality of fourteenth branch sections 382 form a portion of a first electrode (such as a positive electrode) of the second capacitor C2 in the semiconductor capacitor structure of the first embodiment. The second section 334, the plurality of third branch sections 330, the plurality of eighth branch sections 352, the fourth section 354, the plurality of seventh branch sections 350, the plurality of twelfth branch sections 372, the sixth section 374, the plurality of eleventh branch sections 370, the plurality of sixteenth branch sections 392, the eighth section 394, the plurality of fifteenth branch sections 390, and the plurality of fourth branch sections 332 form a portion of a common second electrode (such as a negative electrode) of the first capacitor C1 and the second capacitor C2 in the semiconductor capacitor structure of the first embodiment. An oxide layer is then disposed among those above-mentioned metal layer structures (i.e., among the various sections and branch sections) as a dielectric material.

By observing the above capacitor structure, a person of ordinary skill in the pertinent art should understand that the parallel-interdigitated second branch sections 322 and third branch sections 330, the parallel-interdigitated first branch sections 320 and fourth branch sections 332, the parallel-interdigitated tenth branch sections 362 and eleventh branch sections 370, and the parallel-interdigitated ninth branch sections 360 and twelfth branch sections 372 significantly contribute to the capacitance effect of the first capacitor C1, and the parallel-interdigitated sixth branch sections 342 and seventh branch sections 350, the parallel-interdigitated fifth branch sections 340 and eighth branch sections 352, the parallel-interdigitated fourteenth branch sections 382 and fifteenth branch sections 390, and the parallel-interdigitated thirteenth branch sections 380 and sixteenth branch sections 392 significantly contribute to the capacitance effect of the second capacitor C2.

To be more specific, the layout pattern of the first odd metal layers 300 shown in FIG. 3 is formed along, from outer to inner and from larger to smaller, a plurality of circular ring-shaped contours. Within the layout pattern, the most outer branch section of the plurality of first branch sections 320, of the plurality of third branch sections 330, of the plurality of fifth branch sections 340, of the plurality of seventh branch sections 350, of the plurality of ninth branch sections 360, of the plurality of eleventh branch sections 370, of the plurality of thirteenth branch sections 380, and of the plurality of fifteenth branch sections 390 make up a complete ring type structure by developing along the most outer (i.e., the largest) of the above-mentioned circular ring-shaped contours (i.e., the dotted line Y). Since the most outer branch section of the plurality of first branch sections 320, of the plurality of third branch sections 330, of the plurality of fifth branch sections 340, of the plurality of seventh branch sections 350, of the plurality of ninth branch sections 360, of the plurality of eleventh branch sections 370, of the plurality of thirteenth branch sections 380, and of the plurality of fifteenth branch sections 390 mentioned above develop along the same ring-shaped contour (i.e., the most outer ring-shaped contour), the capacitance effect contributed by these branch sections will be far more symmetrical than the conventional semiconductor capacitor structures in terms of geometrical scheme.

In addition, the most outer branch section of the plurality of second branch sections 322, of the plurality of fourth branch sections 332, of the plurality of sixth branch sections 342, of the plurality of eighth branch sections 352, of the plurality of tenth branch sections 362, of the plurality of fourteenth branch sections 382, and of the plurality of sixteenth branch sections 392 make up a complete ring type structure by developing along the second most outer (i.e., the second largest) of the above ring-shaped contours. Since the most outer branch section of the plurality of second branch sections 322, of the plurality of fourth branch sections 332, of the plurality of sixth branch sections 342, of the plurality of eighth branch sections 352, of the plurality of tenth branch sections 362, of the plurality of fourteenth branch sections 382, and of the plurality of sixteenth branch sections 392 mentioned above develop along the same ring-shaped contour (i.e. the second outer ring-shaped contour), the capacitance effect contributed by these two branches will be far more symmetrical than the conventional semiconductor capacitor structures in terms of geometrical scheme.

As shown in FIG. 3 and similar as described above, each branch section of the plurality of first branch sections 320, of the plurality of third branch sections 330, of the plurality of fifth branch sections 340, of the plurality of seventh branch sections 350, of the plurality of ninth branch sections 360, of the plurality of eleventh branch sections 370, of the plurality of thirteenth branch sections 380, and of the plurality of fifteenth branch sections 390, and each branch section of the plurality of second branch sections 322, of the plurality of fourth branch sections 332, of the plurality of sixth branch sections 342, of the plurality of eighth branch sections 352, of the plurality of tenth branch sections 362, of the plurality of fourteenth branch sections 382, and of the plurality of sixteenth branch sections 392 are respectively formed along one of the ring-shaped contours. As such in this embodiment, since the semiconductor capacitor structure of the present invention has a characteristic of having each of the plurality of parallel interdigitated branch sections developing along certain ring-shaped contours, the semiconductor capacitor structure of the present invention can attain optimized geometrical symmetry and have maximized unit capacitance.

In addition, a first included angle $\Theta 1$ lies between the second section 334 and the eighth section 394, as well as between the fourth section 354 and the sixth section 374; while a second included angle $\Theta 2$ lies between the second section 334 and the fourth section 354, as well as between the sixth section 374 and the eighth section 394. A capacitance value ratio between the first capacitor C1 and the second capacitor C2 in the semiconductor capacitor structure of the present invention is then equal to an angle value ratio between the first included angle $\Theta 1$ and the second included angle $\Theta 2$. In other words, a capacitance value ratio between the first capacitor C1 and the second capacitor C2 in the semiconductor capacitor structure of the present invention can be easily determined by adjusting an angle value ratio between the first included angle $\Theta 1$ and the second included angle $\Theta 2$. In contrast, the semiconductor capacitor structure in the conventional art can only have the first capacitor C1 and the second capacitor C2 with a fixed capacitance value ratio of 1:1.

As shown in FIG. 4, in this embodiment the first even metal layer 400 includes: a plurality of seventeenth branch sections 420 parallel to one another, a plurality of eighteenth branch sections 422 parallel to one another, a ninth section 424, a plurality of nineteenth branch sections 430 parallel to one another, a plurality of twentieth branch sections 432 parallel to one another, a plurality of twenty-first branch sections 440 parallel to one another, a plurality of twenty-second branch sections 442 parallel to one another, an eleventh section 444, a plurality of twenty-third branch sections 450 parallel to one another, a plurality of twenty-fourth branch sections 452 parallel to one another, a plurality of twenty-fifth branch sections 460 parallel to one another, a plurality of twenty-sixth branch sections 462 parallel to one another, a thirteenth section 464, a plurality of twenty-seventh branch sections 470 parallel to one another, a plurality of twenty-eighth branch sections 472 parallel to one another, a plurality of twenty-ninth branch sections 480 parallel to one another, a plurality of thirtieth branch sections 482 parallel to one another, a fifteenth section 484, a plurality of thirty-first branch sections 490 parallel to one another, a plurality of thirty-second branch sections 492 parallel to one another, a tenth section 434, a twelfth section 454, a fourteenth section 474, and a sixteenth section 494.

In FIG. 4, the plurality of seventeenth branch sections 420, the plurality of eighteenth branch sections 422, the ninth section 424, the plurality of nineteenth branch sections 430, the plurality of twentieth branch sections 432, the plurality of twenty-first branch sections 440, the plurality of twenty-second branch sections 442, the eleventh section 444, the plurality of twenty-third branch sections 450, the plurality of twenty-fourth branch sections 452, the plurality of twenty-fifth branch sections 460, the plurality of twenty-sixth branch sections 462, the thirteenth section 464, the plurality of twenty-seventh branch sections 470, the plurality of twenty-eighth branch sections 472, the plurality of twenty-ninth branch sections 480, the plurality of thirtieth branch sections 482, the fifteenth section 484, the plurality of thirty-first branch sections 490, the plurality of thirty-second branch sections 492, the tenth section 434, the twelfth section 454, the fourteenth section 474, and the sixteenth section 494 are respectively positioned above or below, and respectively overlap and align with the plurality of first branch sections 320, the plurality of second branch sections 322, the first section 324, the plurality of third branch sections 330, the plurality of fourth branch sections 332, the plurality of fifth branch sections 340, the plurality of sixth branch sections 342, the third section 344, the plurality of seventh branch sections 350, the plurality of eighth branch sections 352, the plurality of ninth branch sections 360, the plurality of tenth branch sections 362, the fifth section 364, the plurality of eleventh branch sections 370, the plurality of twelfth branch sections 372, the plurality of thirteenth branch sections 380, the plurality of fourteenth branch sections 382, the seventh section 384, the plurality of fifteenth branch sections 390, the plurality of sixteenth branch sections 392, the second section 334, the fourth section 354, the sixth section 374, and the eighth section 394 of the first odd metal layer 300 as shown in FIG. 3. In other words, the capacitor structure in the first even metal layers 400 is a duplicate of the capacitor structure in the first odd metal layers 300 in this embodiment.

Figure 5:
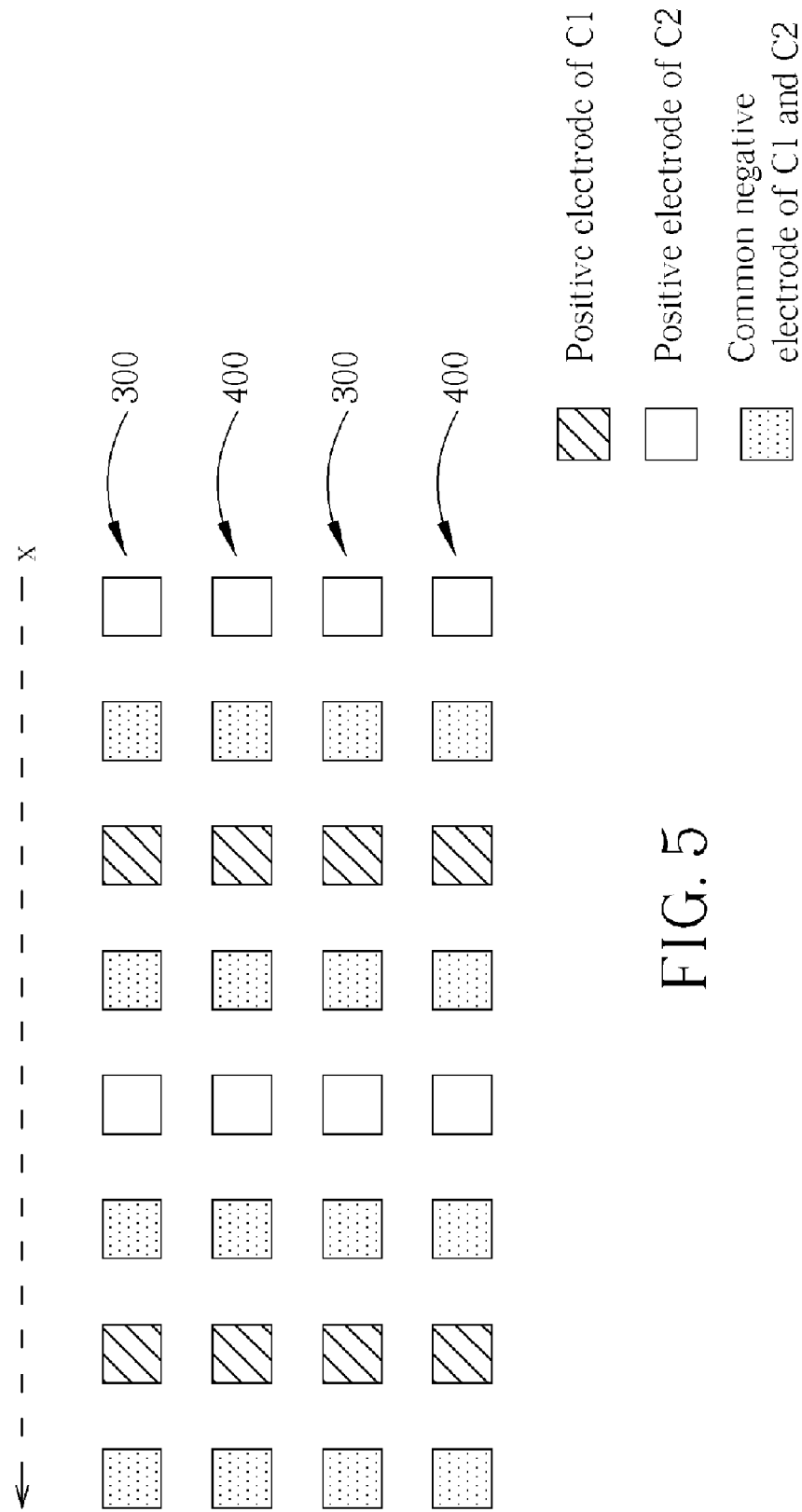
FIG. 5 is a cross-sectional schematic diagram of a plurality of first odd metal layers and a plurality of first even metal layers of the semiconductor capacitor structure in accordance with the first embodiment of the present invention.

Further in this embodiment, the first odd metal layer 300 and the first even metal layer 400 can be electrically connected to each other through a plurality of via plugs (not shown) at proper positions, such as at the positions of the first section 324, ninth section 424, the fifth section 364, and the thirteenth section 464, so as to form the first electrode of the first capacitor C1 in the semiconductor capacitor structure. Similarly, the first odd metal layer 300 and the first even metal layer 400 can be electrically connected to each other through a plurality of via plugs (not shown) at proper positions, such as at the positions of the third section 344, eleventh section 444, the seventh section 384, and the fifteenth section 484, so as to form the first electrode of the second capacitor C2 in the semiconductor capacitor structure. In addition, the first odd metal layer 300 and the first even metal layer 400 can be electrically connected to each other through a plurality of via plugs (not shown) at proper positions, such as at the positions of the second section 334, tenth section 434, fourth section 354, the twelfth section 454, the sixth section 374, the fourteenth section 474, the eighth section 394, and the sixteenth section 494, so as to form a common second electrode of the first capacitor C1 and the second capacitor C2 in the semiconductor capacitor structure. In this way, the respective capacitance value of the first capacitor C1 and the second capacitor C2 in each metal layer can be summed up via parallel connection. Please refer to FIG. 5. FIG. 5 is a cross-sectional schematic diagram of a plurality of first odd metal layers 300 and a plurality of first even metal layers 400 of the semiconductor capacitor structure in accordance with the first embodiment of the present invention, wherein the cross-sectional diagram is formed along the dotted lines X shown in FIG. 3 and FIG. 4. Please note that the plug disposing positions of each electrode mentioned above are not limited to those described in this embodiment; even if the plugs are disposed at other positions in the semiconductor capacitor structure or outside the semiconductor capacitor structure, a semiconductor capacitor structure so arranged still falls within the scope of the present invention.

Figure 6:
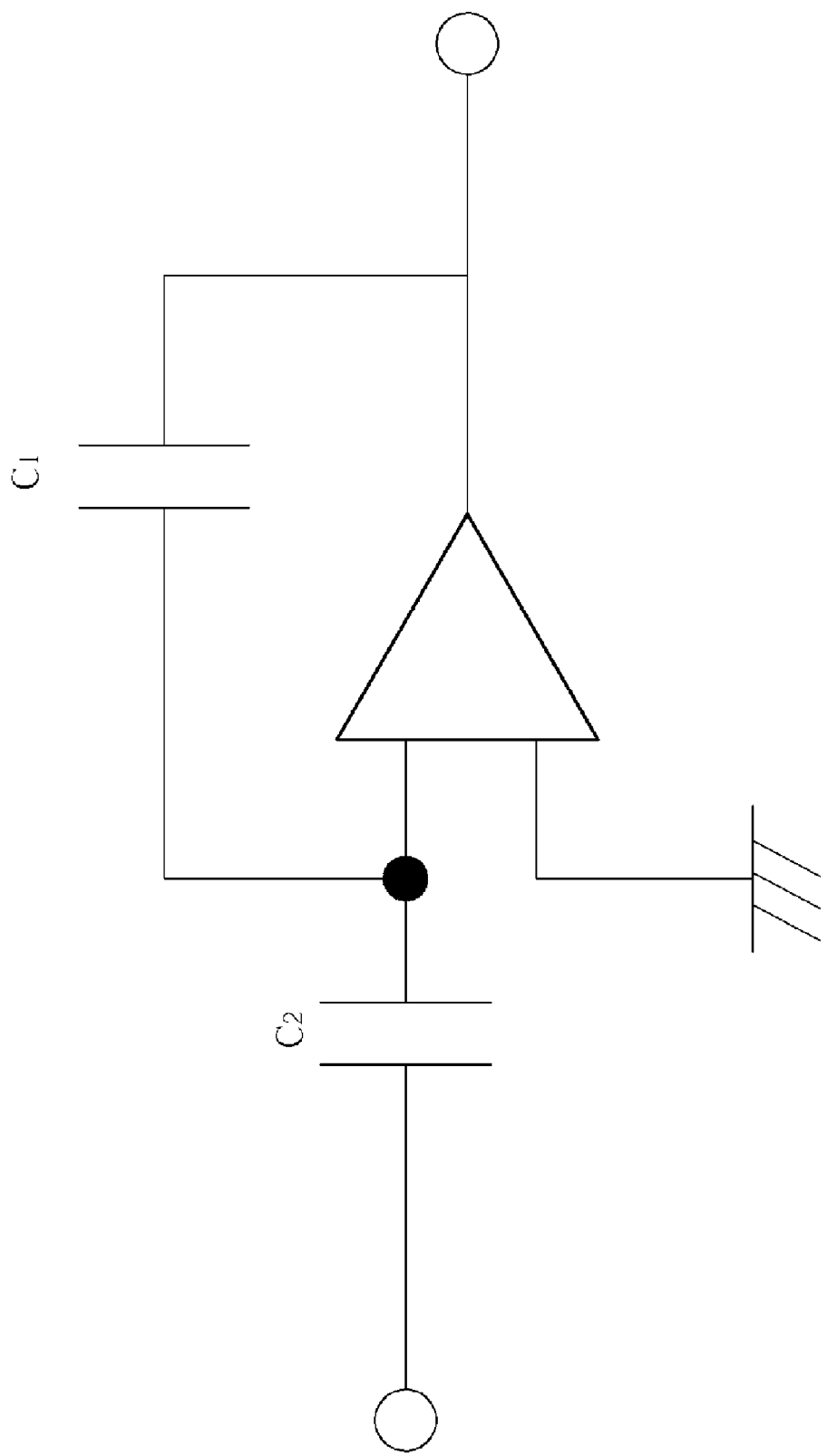
FIG. 6 is a schematic diagram of a circuit scheme utilizing the semiconductor capacitor structure in the first embodiment of the present invention.

Please refer to FIG. 6. FIG. 6 is a schematic diagram of a circuit scheme 10 utilizing the semiconductor capacitor structure in the first embodiment of the present invention. The circuit scheme 10 shown in FIG. 6 is a well-known circuit implementation in the circuit design field. Because an electrode of the first capacitor C1 is short-circuit connection with an electrode of the second capacitor C2, the semiconductor capacitor structure shown in FIG. 3 and FIG. 4 is especially suitable to realize this type of circuit implementation. Please note that the circuit implementation shown in FIG. 6 is only for illustrative purpose and is not meant to be a limitation of the present invention.

Figure 7:
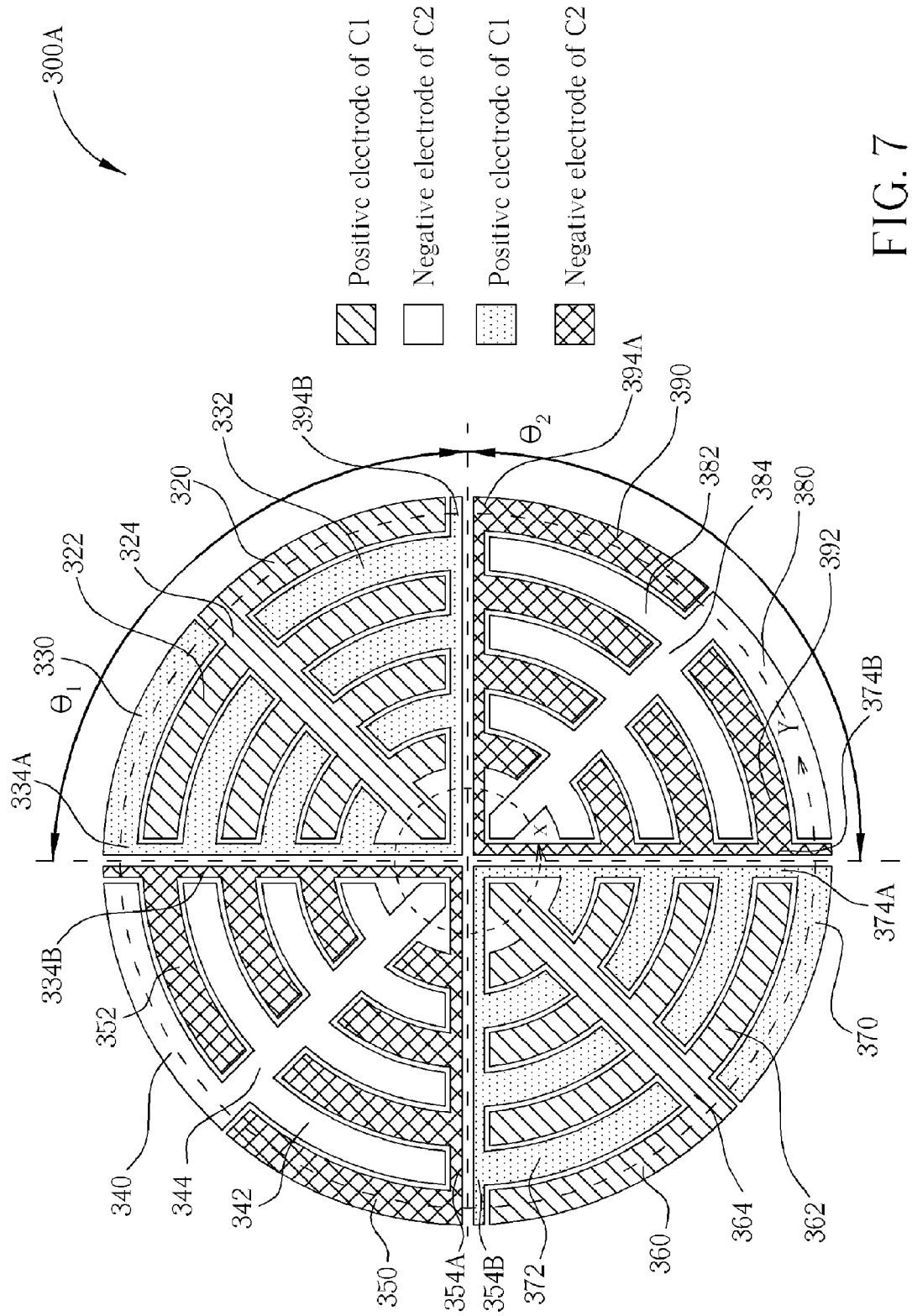
FIG. 7 is a top view schematic diagram of a first odd metal layer of a semiconductor capacitor structure in accordance with a second embodiment of the present invention.
Figure 8:
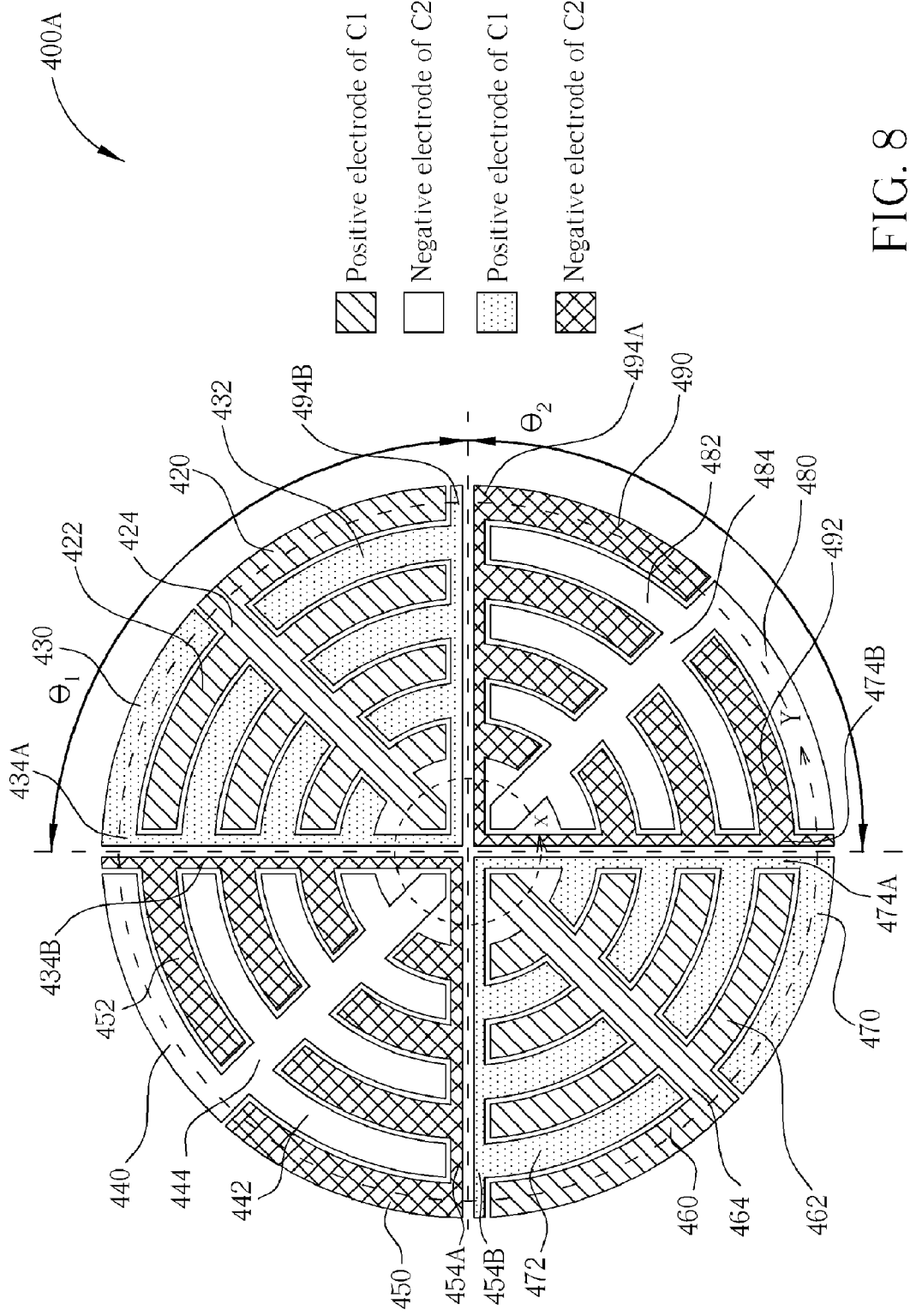
FIG. 8 is a top view schematic diagram of a first even metal layer of the semiconductor capacitor structure in accordance with the second embodiment of the present invention.

Next, please refer to FIG. 7 and FIG. 8 together. FIG. 7 is a top view schematic diagram of a first odd metal layer 300A of a semiconductor capacitor structure in accordance with a second embodiment of the present invention, and FIG. 8 is a top view schematic diagram of a first even metal layer 400A of the semiconductor capacitor structure. Similar to the semiconductor capacitor structure of the first embodiment, the semiconductor capacitor structure of the second embodiment also includes a first capacitor C1 and a second capacitor C2. The first odd metal layer 300A and the first even metal layer 400A in the semiconductor capacitor structure of the second embodiment have similar geometrical layout pattern implementation as the first odd metal layer 300 and the first even metal layer 400 in the semiconductor capacitor structure of the first embodiment. Thus, the labeling of the components of the first odd metal layer 300A shown in FIG. 7 are the same as those of the first odd metal layer 300 shown in FIG. 3, and the labeling of the components of the first even metal layer 400A shown in FIG. 8 are the same as those of the first even metal layer 400 shown in FIG. 4.

However, differences between the first odd metal layer 300A shown in FIG. 7 and the first odd metal layer 300 shown in FIG. 3 can be found as shown in FIG. 7 and as follows: the second section 334 of the first odd metal layer 300 shown in FIG. 3 is further separated into a first sub-section 334A and a second sub-section 334B, wherein the first sub-section 334A is coupled to the plurality of third branch sections 330, and the second sub-section 334B is coupled to the plurality of eighth branch sections 352; the fourth section 354 of the first odd metal layer 300 shown in FIG. 3 is further separated into a third sub-section 354A and a fourth sub-section 354B, wherein the third sub-section 354A is coupled to the plurality of seventh branch sections 350, and the fourth sub-section 354B is coupled to the plurality of twelfth branch sections 372; the sixth section 374 of the first odd metal layer 300 shown in FIG. 3 is further separated into a fifth sub-section 374A and a sixth sub-section 374B, wherein the fifth sub-section 374A is coupled to the plurality of eleventh branch sections 370, and the sixth sub-section 374B is coupled to the plurality of sixteenth branch sections 392; the eighth section 394 of the first odd metal layer 300 shown in FIG. 3 is further separated into a seventh sub-section 394A and an eighth sub-section 394B, wherein the seventh sub-section 394A is coupled to the plurality of fifteenth branch sections 390, and the eighth sub-section 394B is coupled to the plurality of fourth branch sections 332.

The first sub-section 334A and the eighth sub-section 394B are connected with each other to form an L-shaped structure referred to herein as a seventeenth section. The fourth sub-section 354B and the fifth sub-section 374A are connected with each other to form an L-shaped structure referred to herein as a nineteenth section. Both the seventeenth section and the nineteenth section have a first included angle $\Theta 1$. The second sub-section 334B and the third sub-section 354A are connected with each other to form an L-shaped structure referred to herein as an eighteenth section. The sixth sub-section 374B and the seventh sub-section 394A are connected with each other to form an L-shaped structure referred to herein as a twentieth section. Both the eighteenth section and the twentieth section have a second included angle $\Theta 2$. As such, in the first odd metal layer 300A shown in FIG. 7, the first sub-section 334A, the plurality of third branch sections 330, the eighth sub-section 394B, the plurality of fourth branch sections 332, the fourth sub-section 354B, the plurality of twelfth branch sections 372, the fifth sub-section 374A, and the plurality of eleventh branch sections 370 together form a portion of a second electrode (such as a negative electrode) of the first capacitor C1. The second sub-section 334B, the plurality of eighth branch sections 352, the third sub-section 354A, the plurality of seventh branch sections 350, the sixth sub-section 374B, the plurality of sixteenth branch sections 392, the seventh sub-section 394A, and the plurality of fifteenth branch sections 390 together form a portion of a second electrode (such as a negative electrode) of the second capacitor C2.

Similarly, differences between the first even metal layer 400A shown in FIG. 8 and the first even metal layer 400 shown in FIG. 4 can be found as shown in FIG. 8 and as follows: the tenth section 434 of the first even metal layer 400 shown in FIG. 4 is further separated into a ninth sub-section 434A and a tenth sub-section 434B, wherein the ninth sub-section 434A is coupled to the plurality of nineteenth branch sections 430, and the tenth sub-section 434B is coupled to the plurality of twenty-fourth branch sections 452; the twelfth section 454 of the first even metal layer 400 shown in FIG. 4 is further separated into an eleventh sub-section 454A and a twelfth sub-section 454B, wherein the eleventh sub-section 454A is coupled to the plurality of twenty-third branch sections 450, and the twelfth sub-section 454B is coupled to the plurality of twenty-eighth branch sections 472; the fourteenth section 474 of the first even metal layer 400 shown in FIG. 4 is further separated into a thirteenth sub-section 474A and a fourteenth sub-section 474B, wherein the thirteenth sub-section 474A is coupled to the plurality of twenty-seventh branch sections 470, and the fourteenth sub-section 474B is coupled to the plurality of thirty-second branch sections 492; the sixteenth section 494 of the first even metal layer 400 shown in FIG. 4 is further separated into a fifteenth sub-section 494A and a sixteenth sub-section 494B, wherein the fifteenth sub-section 494A is coupled to the plurality of thirty-first branch sections 490, and the sixteenth sub-section 494B is coupled to the plurality of twentieth branch sections 432.

The ninth sub-section 434A and the sixteenth sub-section 494B are connected with each other to form an L-shaped structure referred to herein as a twenty-first section. The twelfth sub-section 454B and the thirteenth sub-section 474A are connected with each other to form an L-shaped structure referred to herein as a twenty-third section. Both the twenty-first section and the twenty-third section have a first included angle $\theta 1$. The tenth sub-section 434B and the eleventh sub-section 454A are connected with each other to form an L-shaped structure referred to herein as a twenty-second section. The fourteenth sub-section 474B and the fifteenth sub-section 494A are connected with each other to form an L-shaped structure referred to herein as a twenty-fourth section. Both the twenty-second section and the twenty-fourth section have a second included angle $\theta 2$. As such, in the first even metal layer 400A shown in FIG. 8, the ninth sub-section 434A, the plurality of nineteenth branch sections 430, the sixteenth sub-section 494B, the plurality of twentieth branch sections 432, the twelfth sub-section 454B, the plurality of twenty-eighth branch sections 472, the thirteenth sub-section 474A, and the plurality of thirteenth branch sections 470 together form a portion of a second electrode (such as a negative electrode) of the first capacitor C1. The tenth sub-section 434B, the plurality of twenty-fourth branch sections 452, the eleventh sub-section 454A, the plurality of twenty-third branch sections 450, the fourteenth sub-section 474B, the plurality of thirty-second branch sections 492, the fifteenth sub-section 494A, and the plurality of thirty-first branch sections 490 together form a portion of a second electrode (such as a negative electrode) of the second capacitor C2.

Figure 9:
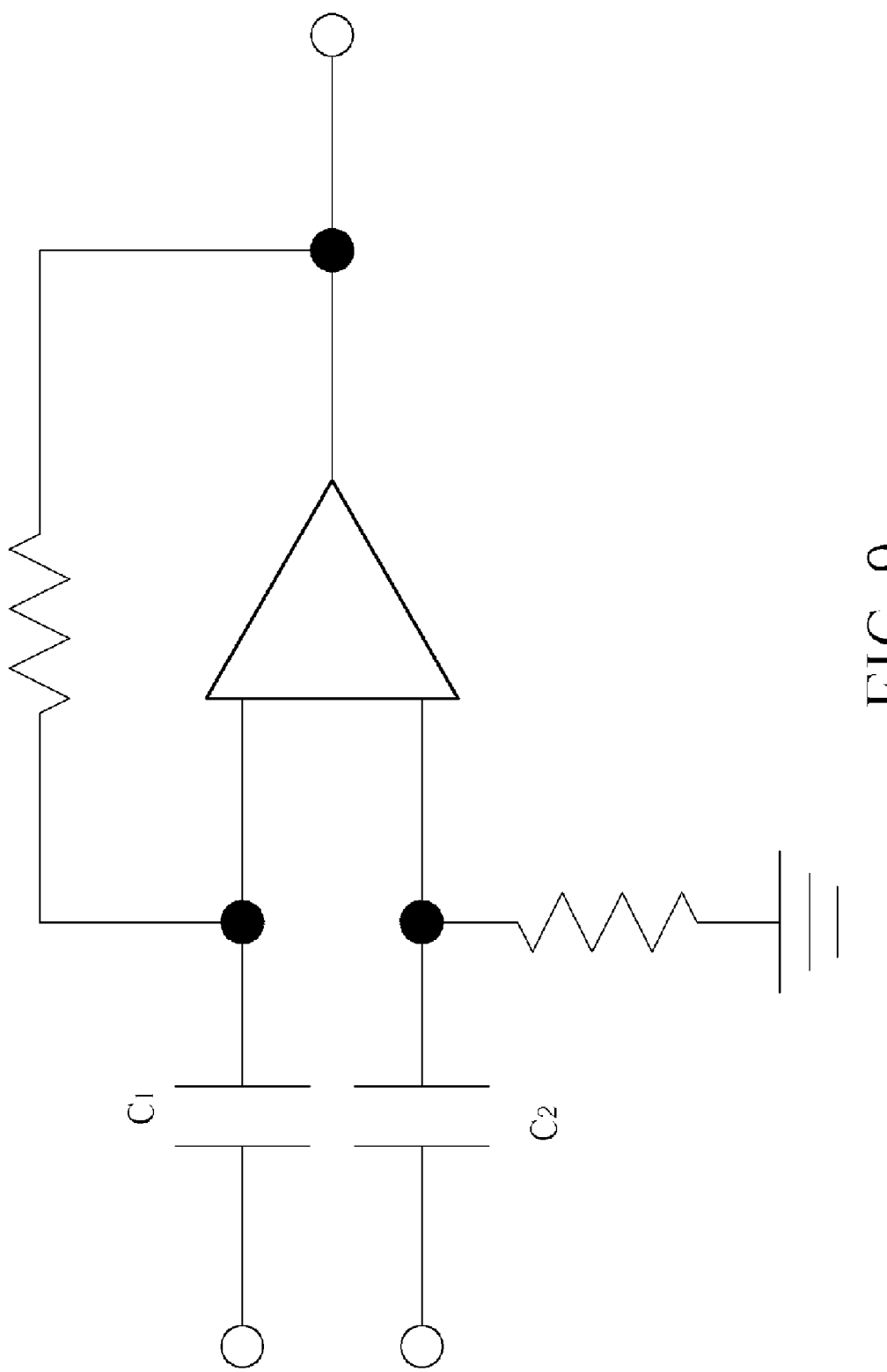
FIG. 9 is a schematic diagram of a circuit scheme utilizing the semiconductor capacitor structure in the second embodiment of the present invention.

In this embodiment, a capacitance value ratio between the first capacitor C1 and the second capacitor C2 in the semiconductor capacitor structure of the present invention is equal to an angle value ratio between the first included angle $\Theta 1$ and the second included angle $\Theta 2$. In other words, a capacitance value ratio between the first capacitor C1 and the second capacitor C2 in the semiconductor capacitor structure of the present invention can be easily determined by adjusting an angle value ratio between the first included angle $\Theta 1$ and the second included angle $\Theta 2$. In contrast, the semiconductor capacitor structure in the conventional art can only have the first capacitor C1 and the second capacitor C2 with a fixed capacitance value ratio of 1:1. In addition, please refer to FIG. 9. FIG. 9 is a schematic diagram of a circuit scheme 20 utilizing the semiconductor capacitor structure in the second embodiment of the present invention. The circuit scheme 20 shown in FIG. 9 is a well-known circuit implementation in the circuit design field. Because an electrode of the first capacitor C1 is not electrically short-circuit connected to an electrode of the second capacitor C2, the semiconductor capacitor structure shown in FIG. 7 and FIG. 8 is especially suitable to realize this type of circuit implementation. Please note that the circuit implementation shown in FIG. 9 is only for illustrative purpose and is not meant to be a limitation of the present invention.

Figure 10:
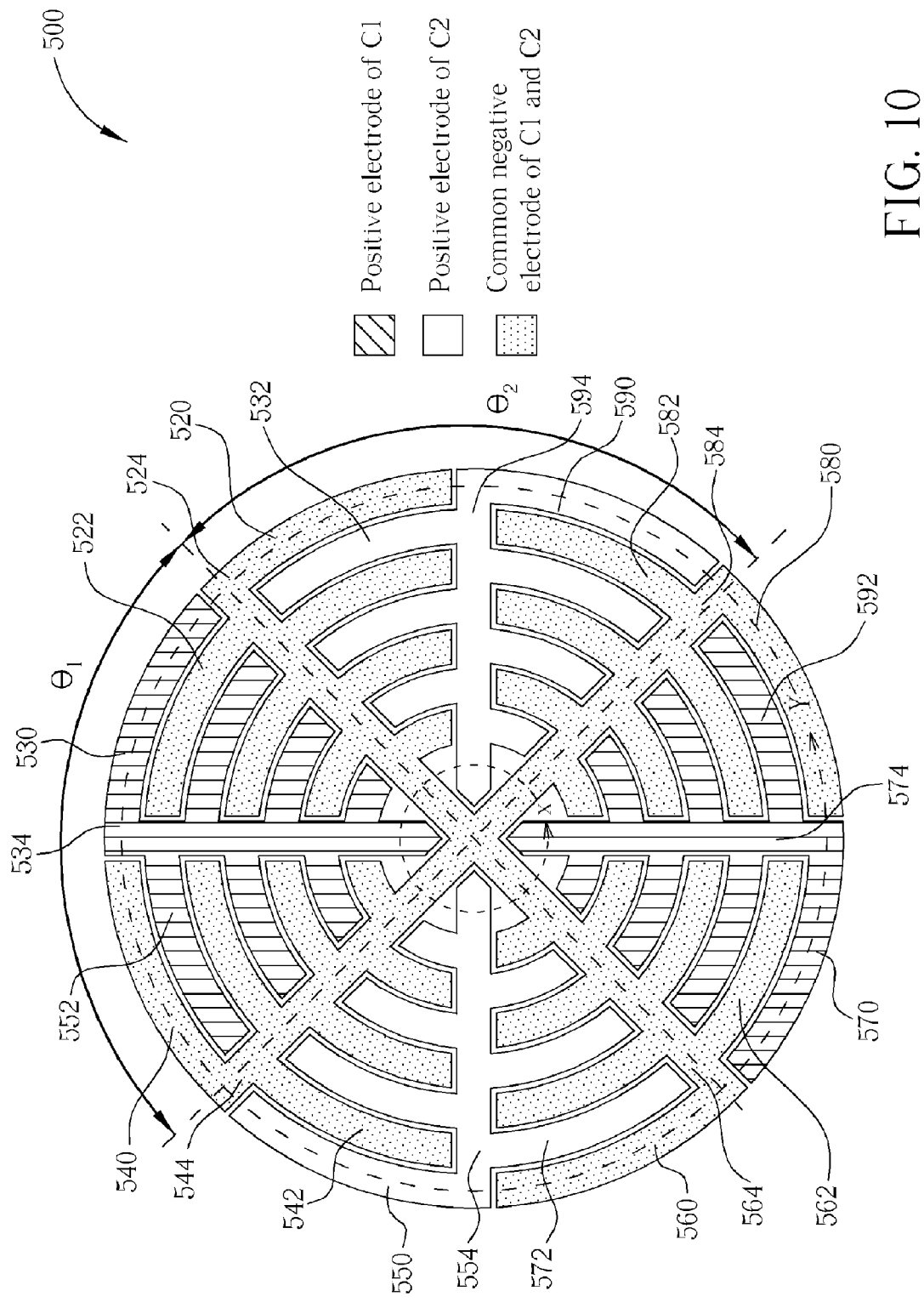
FIG. 10 is a top view schematic diagram of a first even metal layer collocated with the first odd metal layer in FIG. 3 to form a semiconductor capacitor structure in accordance with a third embodiment of the present invention.
Figure 11:
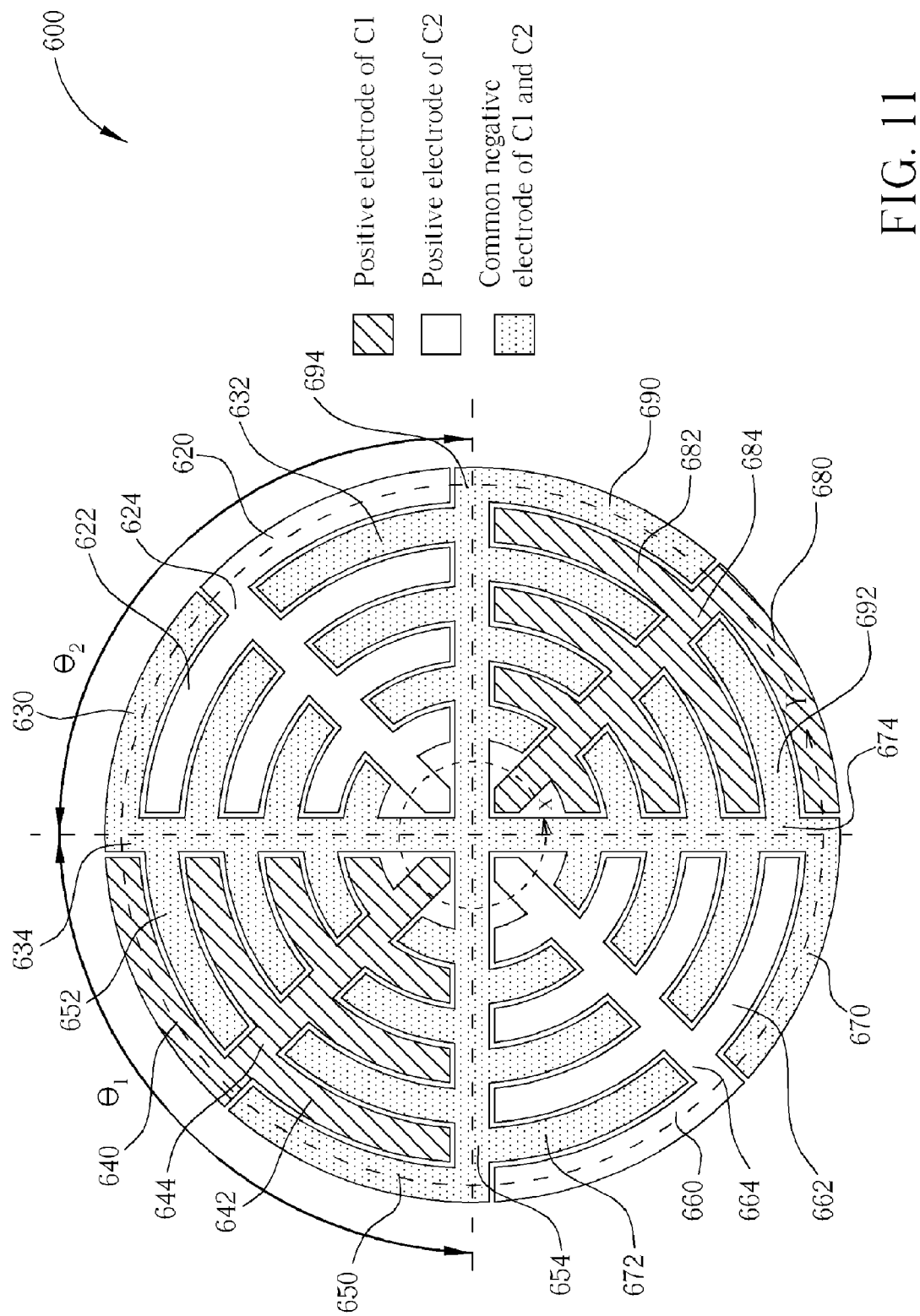
FIG. 11 is a top view schematic diagram of a second odd metal layer collocated with the first odd metal layer in FIG. 3 to form the semiconductor capacitor structure in accordance with the third embodiment of the present invention.
Figure 12:
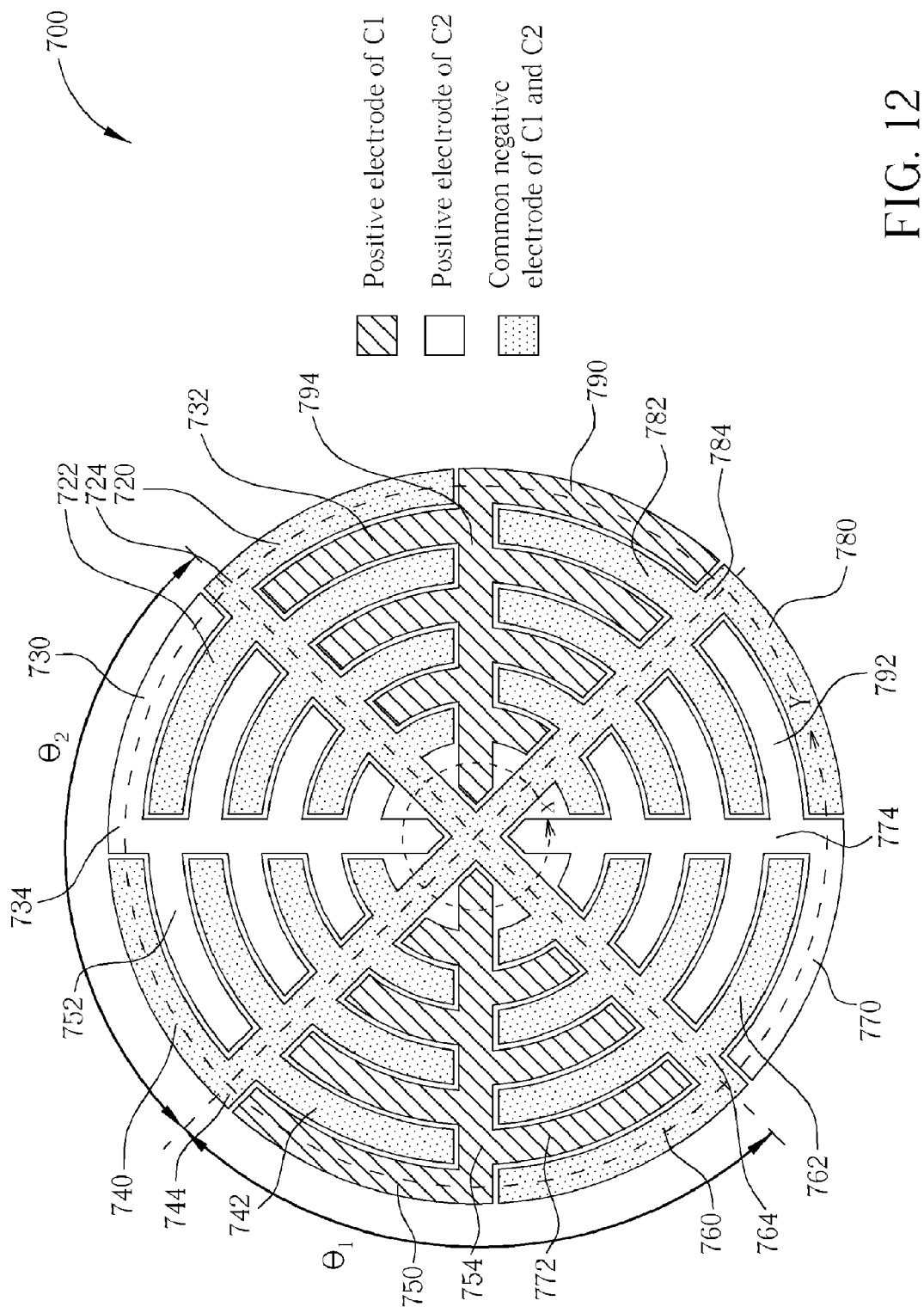
FIG. 12 is a top view schematic diagram of a second even metal layer collocated with the first odd metal layer in FIG. 3 to form the semiconductor capacitor structure in accordance with the third embodiment of the present invention.
Figure 13:
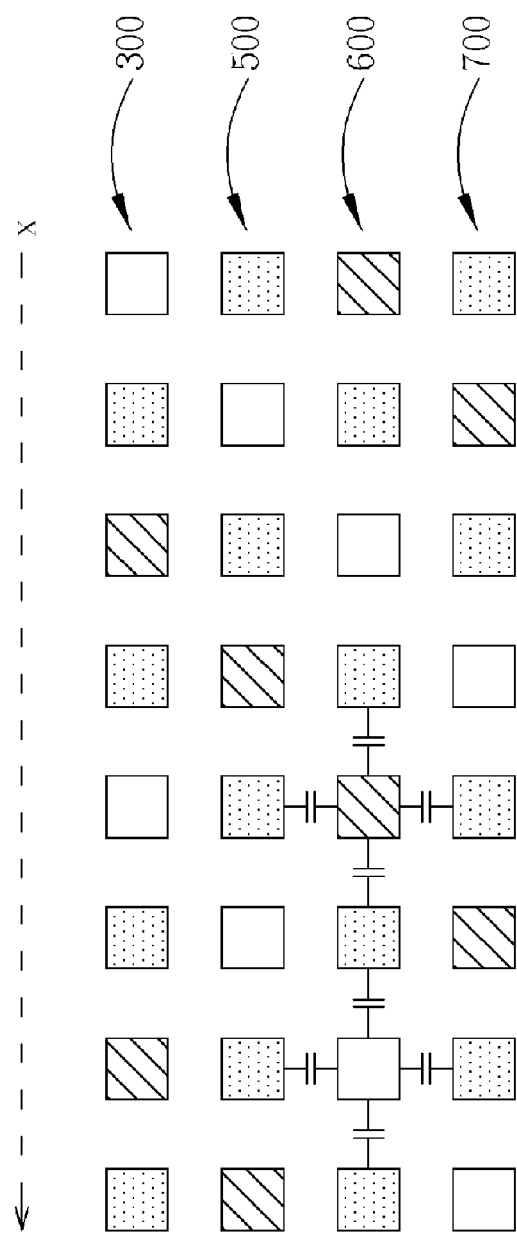
FIG. 13 is a cross-sectional schematic diagram of the first odd metal layers, the first even metal layer, the second odd metal layer, and the second even metal layer of the semiconductor capacitor structure in accordance with the third embodiment of the present invention.

Next, please refer to FIG. 10, FIG. 11, and FIG. 12 together. FIG. 10, FIG. 11, and FIG. 12 are top view schematic diagrams of a first even metal layer 500, a second odd metal layer 600, and a second even metal layer 700 collocated with the first odd metal layer 300 in FIG. 3 to form a semiconductor capacitor structure in accordance with a third embodiment of the present invention. In the interest of brevity, descriptions already provided in connection with other embodiments, will not be repeated. In this regard, the last two digits of reference numbers in the embodiments of FIGS. 10-12 are selected for consistency with previous embodiments. For example, reference number 532 of FIG. 10 corresponds to reference 332 of the embodiment of FIG. 7 (or 432 of the embodiment of FIG. 8). Therefore, the use of reference numbers in this fashion will help to keep the description brief, by avoiding unnecessary duplicative descriptions. As shown in FIG. 10, the geometrical layout pattern implementation of the first even metal layer 500 is the geometrical layout pattern implementation of the first odd metal layer 300 after being rotated counterclockwise by 45 degrees. As shown in FIG. 11, the geometrical layout pattern implementation of the second odd metal layer 600 is the geometrical layout pattern implementation of the first even metal layer 500 after being rotated counterclockwise by 45 degrees. Next, as shown in FIG. 12, the geometrical layout pattern implementation of the second even metal layer 700 is the geometrical layout pattern implementation of the second odd metal layer 600 after being rotated counterclockwise by 45 degrees. In this way, in addition to the sum-up effect of the capacitance value of the various metal layers through parallel connection, there will be an even higher parasitic capacitance value contributed by the interdigitated structure in vertical direction made up between every two layers of the metal layers. Please refer to FIG. 13. FIG. 13 is a cross-sectional schematic diagram of the first odd metal layers 300, the first even metal layer 500, the second odd metal layer 600, and the second even metal layer 700 of the semiconductor capacitor structure in accordance with the third embodiment of the present invention, wherein the cross-sectional diagram is formed along the dotted lines X shown in FIG. 3, FIG. 10, FIG. 11, and FIG. 12.

Figure 14:
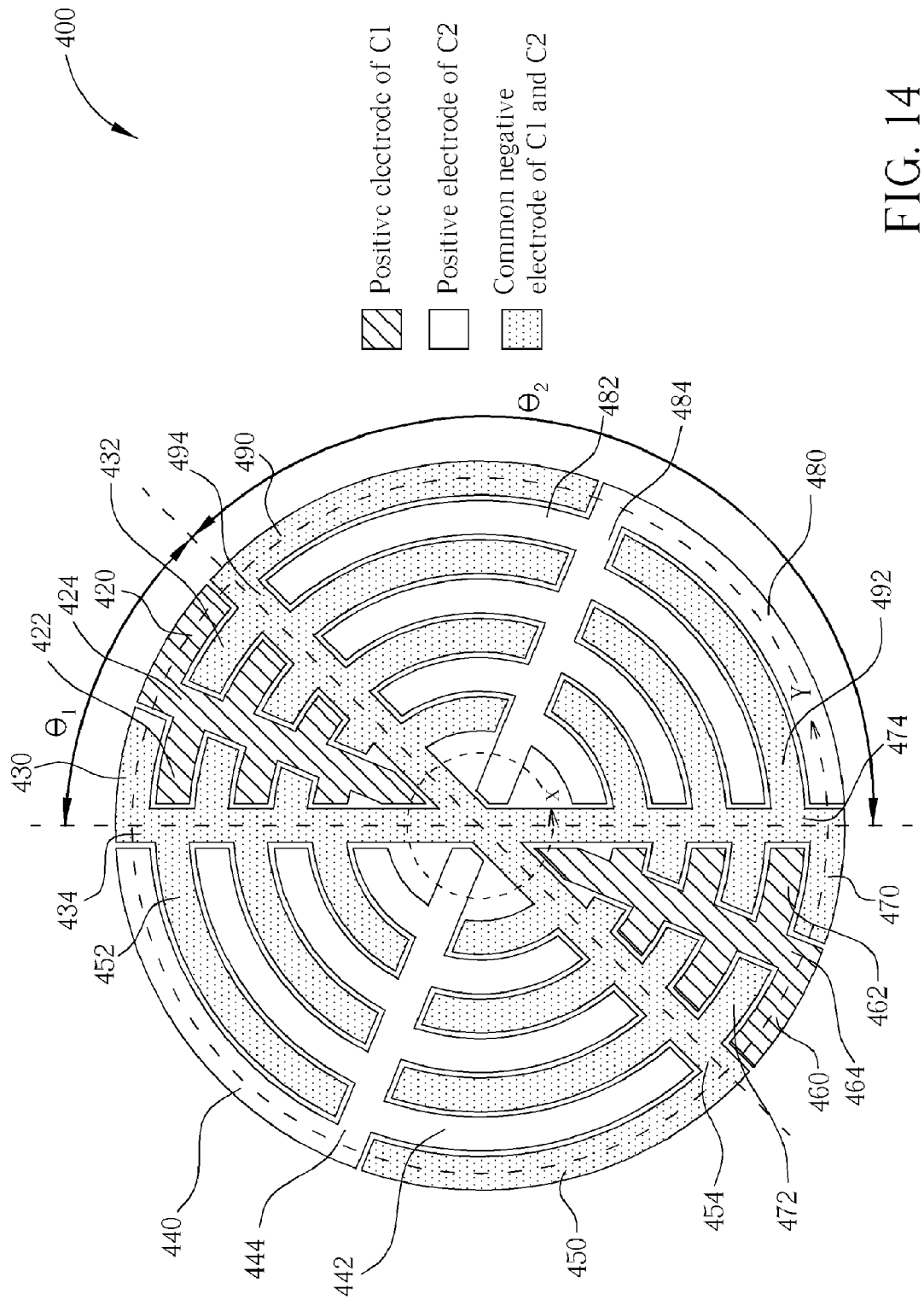
FIG. 14 is a top view schematic diagram of an odd metal layer of a semiconductor capacitor structure in accordance with another embodiment of the present invention.

In addition, please again refer to FIG. 3 here the angle values of the first included angle Θ1 and the second included angle Θ2 in FIG. 3 are 90 degrees, respectively. However, since a capacitance value ratio between the first capacitor C1 and the second capacitor C2 in the semiconductor capacitor structure of the present invention is equal to an angle value ratio between the first included angle Θ1 and the second included angle Θ2, the capacitance value ratio between the first capacitor C1 and the second capacitor C2 in the semiconductor capacitor structure of the present invention can be easily determined by adjusting an angle value ratio between the first included angle Θ1 and the second included angle Θ2 according to varied circuit design needs. For example, when a circuit design requires the first capacitor C1 and the second capacitor C2 having a capacitance value ratio of 1:3 in another embodiment of the present invention, the present invention can adjust the angle values of the first included angle Θ1 and the second included angle Θ2 to be, respectively, 45 degrees and 135 degrees as shown in FIG. 14, so as to meet the requirement of circuit design.

Figure 15:
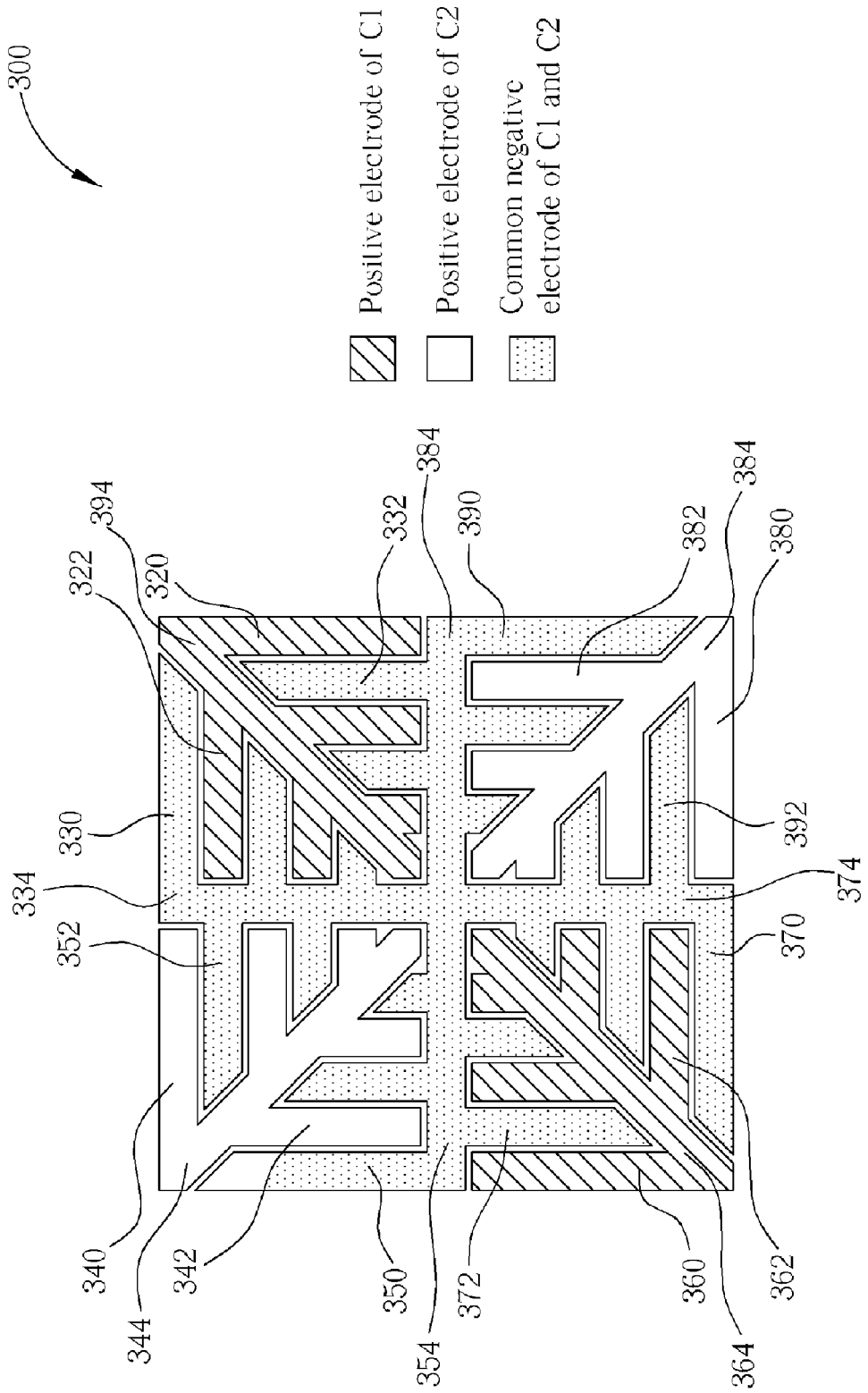
FIG. 15 is a top view schematic diagram of an odd metal layer of a semiconductor capacitor structure in accordance with another embodiment of the present invention.
Figure 16:
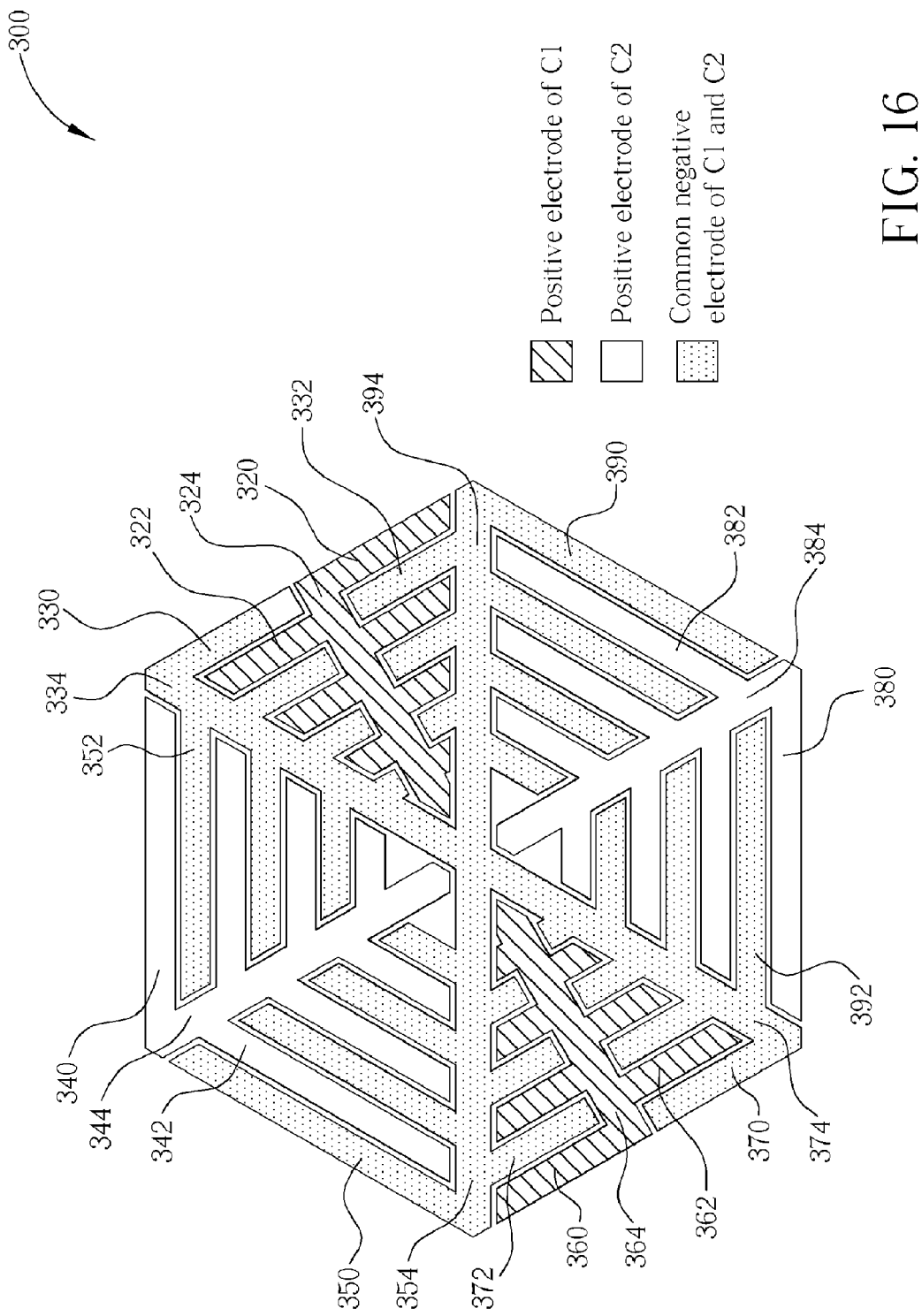
FIG. 16 is a top view schematic diagram of an odd metal layer of a semiconductor capacitor structure in accordance with another embodiment of the present invention.

Although the above embodiments illustrate a semiconductor capacitor structure developed along a circular ring type geometry, those of ordinary skill in the pertinent art should be able to understand that these embodiments are not meant to be limitations of the present invention. For example, the plurality of first branch sections 320, the plurality of third branch sections 330, the plurality of fifth branch sections 340, the plurality of seventh branch sections 350, the plurality of ninth branch sections 360, the plurality of eleventh branch sections 370, the plurality of thirteenth branch sections 380, and the plurality of fifteenth branch sections 390, as well as the plurality of second branch sections 322, the plurality of fourth branch sections 332, the plurality of sixth branch sections 342, the plurality of eighth branch sections 352, the plurality of tenth branch sections 362, the plurality of fourteenth branch sections 382, and the plurality of sixteenth branch sections 392 disposed in the first odd metal layer 300, together with those corresponding portions disposed in the first even metal layer 400 mentioned above, can also develop along a square ring type geometry as shown in FIG. 15, or develop along a hexagonal ring type geometry as shown in FIG. 16. In the embodiment shown in FIG. 15, the capacitance value ratio between the first capacitor C1 and the second capacitor C2 in the semiconductor capacitor structure is 1:1. In the embodiment shown FIG. 16, the capacitance value ratio between the first capacitor C1 and the second capacitor C2 in the semiconductor capacitor structure is 1:2. Please note that the above shapes and embodiments are only for illustrative purpose and are not meant to be limitations of the present invention. In other words, the semiconductor capacitor structure of the present invention can also be formed according to other polygon contours.

In addition, please note that the material utilized to form the first odd metal layers 300, the first even metal layer 400, the first even metal layer 500, the second odd metal layer 600, and the second even metal layer 700 can be either one or more of aluminum, copper, gold, other metals or nonmetal materials in accordance with the adopted semiconductor manufacturing processes, and the adoption of any or all these materials should fall within the scope of the present invention.

As an example, the semiconductor capacitor structure of the present invention forms an oxide layer between the odd metal layer 300 and the even metal layer 400, and forms and interlaces a plurality of oxide layers and a plurality of metal layers above the odd metal layer 300 and/or below the even metal layer 400, so as to complete the MOM capacitor structure. The MOM capacitor structure of the present invention does not need an additional mask beyond standard CMOS process, and therefore the process cost becomes less than the conventional art. In addition, due to improvements in semiconductor process technology, a significantly larger number of metal layers can be stacked, and since the distance between the metal layers becomes smaller, a higher unit capacitance can be attained.

Briefly summarized, the semiconductor capacitor structure composed of a first capacitor and a second capacitor provided by the present invention has a plurality of symmetrical branch sections forming a ring structure. The semiconductor capacitor structure has an optimal geometrical symmetry, and therefore a better capacitance matching effect can be obtained, and the semiconductor capacitor structure has a higher unit capacitance. In addition, a capacitance value ratio between the first capacitor and the second capacitor can be adjusted according to various requirements in the semiconductor capacitor structure.

Those skilled in the art will readily observe that numerous modifications and alterations of the device and method may be made while retaining the teachings of the invention.

What is claimed is:

1. A semiconductor capacitor structure composed of a first capacitor and a second capacitor, comprising:
   a first metal layer, comprising:
      a plurality of first branch sections parallel to one another in a radial direction with respect to a central point;
      a plurality of second branch sections parallel to one another in a radial direction with respect to the central point;
      a first section, coupled to the plurality of first branch sections and the plurality of second branch sections, wherein the first section extends from the central point in a radial direction to contact each of the branches of the first and second branch sections, wherein the branches of the first branch section extend from the first section in a first direction and the branches of the second branch section extend from the first section in a direction opposite the first direction;
      a plurality of third branch sections parallel to one another;
      a plurality of fourth branch sections parallel to one another, wherein the plurality of second branch sections and the plurality of third branch sections interdigitate with each other in parallel, and the plurality of first branch sections and the plurality of fourth branch sections interdigitate with each other in parallel;
      a plurality of fifth branch sections parallel to one another;
      a plurality of sixth branch sections parallel to one another;
      a plurality of seventh branch sections parallel to one another;
      a plurality of eighth branch sections parallel to one another, wherein the plurality of sixth branch sections and the plurality of seventh branch sections interdigitate with each other in parallel, and the plurality of fifth branch sections and the plurality of eighth branch sections interdigitate with each other in parallel;

a second section, coupled to the plurality of third branch sections and the plurality of eighth branch sections;

a third section, coupled to the plurality of fifth branch sections and the plurality of sixth branch sections;

a plurality of ninth branch sections parallel to one another;

a plurality of tenth branch sections parallel to one another;

a plurality of eleventh branch sections parallel to one another;

a plurality of twelfth branch sections parallel to one another, wherein the plurality of tenth branch sections and the plurality of eleventh branch sections interdigitate with each other in parallel, and the plurality of ninth branch sections and the plurality of twelfth branch sections interdigitate with each other in parallel;

a fourth section, coupled to the plurality of seventh branch sections and the plurality of twelfth branch sections;

a fifth section, coupled to the plurality of ninth branch sections and the plurality of tenth branch sections;

a plurality of thirteenth branch sections parallel to one another;

a plurality of fourteenth branch sections parallel to one another;

a plurality of fifteenth branch sections parallel to one another;

a plurality of sixteenth branch sections parallel to one another, wherein the plurality of fourteenth branch sections and the plurality of fifteenth branch sections interdigitate with each other in parallel, and the plurality of thirteenth branch sections and the plurality of sixteenth branch sections interdigitate with each other in parallel;

a sixth section, coupled to the plurality of eleventh branch sections and the plurality of sixteenth branch sections;

a seventh section, coupled to the plurality of thirteenth branch sections and the plurality of fourteenth branch sections; and an eighth section, coupled to the plurality of fifteenth branch sections and the plurality of fourth branch sections;

wherein the first section, the plurality of first branch sections, the plurality of second branch sections, the fifth section, the plurality of ninth branch sections, and the plurality of tenth branch sections make up a portion of a first electrode of the first capacitor; the third section, the plurality of fifth branch sections, the plurality of sixth branch sections, the seventh section, the plurality of thirteenth branch sections, and the plurality of fourteenth branch sections make up a portion of a first electrode of the second capacitor; and the second section, the plurality of third branch sections, the plurality of eighth branch sections, the fourth section, the plurality of seventh branch sections, the plurality of twelfth branch sections, the sixth section, the plurality of eleventh branch sections, the plurality of sixteenth branch sections, the eighth section, the plurality of fifteenth branch sections, and the plurality of fourth branch sections make up a portion of a common second electrode of the first capacitor and the second capacitor.

2. The semiconductor capacitor structure of claim 1, further comprising:

a second metal layer, comprising:

a plurality of seventeenth branch sections parallel to one another;

a plurality of eighteenth branch sections parallel to one another;

a ninth section, coupled to the plurality of seventeenth branch sections and the plurality of eighteenth branch sections;

a plurality of nineteenth branch sections parallel to one another;

a plurality of twentieth branch sections parallel to one another, wherein the plurality of eighteenth branch sections and the plurality of nineteenth branch sections interdigitate with each other in parallel, and the plurality of seventeenth branch sections and the plurality of twentieth branch sections interdigitate with each other in parallel;

a plurality of twenty-first branch sections parallel to one another;

a plurality of twenty-second branch sections parallel to one another;

a plurality of twenty-third branch sections parallel to one another;

a plurality of twenty-fourth branch sections parallel to one another, wherein the plurality of twenty-second branch sections and the plurality of twenty-third branch sections interdigitate with each other in parallel, and the plurality of twenty-first branch sections and the plurality of twenty-fourth branch sections interdigitate with each other in parallel;

a tenth section, coupled to the plurality of nineteenth branch sections and the plurality of twenty-fourth branch sections;

an eleventh section, coupled to the plurality of twenty-first branch sections and the plurality of twenty-second branch sections;

a plurality of twenty-fifth branch sections parallel to one another;

a plurality of twenty-sixth branch sections parallel to one another;

a plurality of twenty-seventh branch sections parallel to one another;

a plurality of twenty-eighth branch sections parallel to one another, wherein the plurality of twenty-sixth branch sections and the plurality of twenty-seventh branch sections interdigitate with each other in parallel, and the plurality of twenty-fifth branch sections and the plurality of twenty-eighth branch sections interdigitate with each other in parallel;

a twelfth section, coupled to the plurality of twenty-third branch sections and the plurality of twenty-eighth branch sections;

a thirteenth section, coupled to the plurality of twenty-fifth branch sections and the plurality of twenty-sixth branch sections;

a plurality of twenty-ninth branch sections parallel to one another;

a plurality of thirtieth branch sections parallel to one another;

a plurality of thirty-first branch sections parallel to one another;

a plurality of thirty-second branch sections parallel to one another, wherein the plurality of thirtieth branch sections and the plurality of thirty-first branch sections interdigitate with each other in parallel, and the plurality of twenty-ninth branch sections and the plurality of thirty-second branch sections interdigitate with each other in parallel;

a fourteenth section, coupled to the plurality of twenty-seventh branch sections and the plurality of thirty-second branch sections;

a fifteenth section, coupled to the plurality of twenty-ninth branch sections and the plurality of thirtieth branch sections; and a sixteenth section, coupled to the plurality of thirty-first branch sections and the plurality of twentieth branch sections; and a dielectric layer, formed between the first metal layer and the second metal layer;

wherein the ninth section, the plurality of seventeenth branch sections, the plurality of eighteenth branch sections, the thirteenth section, the plurality of twenty-fifth branch sections, and the plurality of twenty-sixth branch sections respectively coincide in the vertical plane with the first section, the plurality of first branch sections, the plurality of second branch sections, the fifth section, the plurality of ninth branch sections, and the plurality of tenth branch sections; the eleventh section, the plurality of twenty-first branch sections, the plurality of twenty-second branch sections, the fifteenth section, the plurality of twenty-ninth branch sections, and the plurality of thirtieth branch sections respectively coincide in the vertical plane with the third section, the plurality of fifth branch sections, the plurality of sixth branch sections, the seventh section, the plurality of thirteenth branch sections, and the plurality of fourteenth branch sections; and the tenth section, the plurality of nineteenth branch sections, the plurality of twenty-fourth branch sections, the twelfth section, the plurality of twenty-third branch sections, the plurality of twenty-eighth branch sections, the fourteenth section, the plurality of twenty-seventh branch sections, the plurality of thirty-second branch sections, the sixteenth section, the plurality of thirty-first branch sections, and the plurality of twentieth branch sections respectively coincide in the vertical plane with the second section, the plurality of third branch sections, the plurality of eighth branch sections, the fourth section, the plurality of seventh branch sections, the plurality of twelfth branch sections, the sixth section, the plurality of eleventh branch sections, the plurality of sixteenth branch sections, the eighth section, the plurality of fifteenth branch sections, and the plurality of fourth branch sections.

3. The semiconductor capacitor structure of claim 2, wherein the ninth section, the plurality of seventeenth branch sections, the plurality of eighteenth branch sections, the thirteenth section, the plurality of twenty-fifth branch sections, and the plurality of twenty-sixth branch sections make up a portion of the first electrode of the first capacitor; the eleventh section, the plurality of twenty-first branch sections, the plurality of twenty-second branch sections, the fifteenth section, the plurality of twenty-ninth branch sections, and the plurality of thirtieth branch sections make up a portion of the first electrode of the second capacitor; and the tenth section, the plurality of nineteenth branch sections, the plurality of twenty-fourth branch sections, the twelfth section, the plurality of twenty-third branch sections, the plurality of twenty-eighth branch sections, the fourteenth section, the plurality of twenty-seventh branch sections, the plurality of thirty-second branch sections, the sixteenth section, the plurality of thirty-first branch sections, and the plurality of twentieth branch sections make up a portion of the common second electrode of the first capacitor and the second capacitor.

4. The semiconductor capacitor structure of claim 2, wherein the tenth section, the plurality of nineteenth branch sections, the plurality of twenty-fourth branch sections, the fourteenth section, the plurality of twenty-seventh branch sections, and the plurality of thirty-second branch sections make up a portion of the first electrode of the first capacitor; the twelfth section, the plurality of twenty-third branch sections, the plurality of twenty-eighth branch sections, the sixteenth section, the plurality of thirty-first branch sections, and the plurality of twentieth branch sections make up a portion of the first electrode of the second capacitor; and the ninth section, the plurality of seventeenth branch sections, the plurality of eighteenth branch sections, the thirteenth section, the plurality of twenty-fifth branch sections, the plurality of twenty-sixth branch sections, the eleventh section, the plurality of twenty-first branch sections, the plurality of twenty-second branch sections, the fifteenth section, the plurality of twenty-ninth branch sections, and the plurality of thirtieth branch sections make up a portion of the common second electrode of the first capacitor and the second capacitor.

5. The semiconductor capacitor structure of claim 2, wherein the ninth section, the plurality of seventeenth branch sections, the plurality of eighteenth branch sections, the thirteenth section, the plurality of twenty-fifth branch sections, and the plurality of twenty-sixth branch sections make up a portion of the first electrode of the second capacitor; the eleventh section, the plurality of twenty-first branch sections, the plurality of twenty-second branch sections, the fifteenth section, the plurality of twenty-ninth branch sections, and the plurality of thirtieth branch sections make up a portion of the first electrode of the first capacitor; and the tenth section, the plurality of nineteenth branch sections, the plurality of twenty-fourth branch sections, the twelfth section, the plurality of twenty-third branch sections, the plurality of twenty-eighth branch sections, the fourteenth section, the plurality of twenty-seventh branch sections, the plurality of thirty-second branch sections, the sixteenth section, the plurality of thirty-first branch sections, and the plurality of twentieth branch sections make up a portion of the common second electrode of the first capacitor and the second capacitor.

6. The semiconductor capacitor structure of claim 2, wherein the tenth section, the plurality of nineteenth branch sections, the plurality of twenty-fourth branch sections, the fourteenth section, the plurality of twenty-seventh branch sections, and the plurality of thirty-second branch sections make up a portion of the first electrode of the second capacitor; the twelfth section, the plurality of twenty-third branch sections, the plurality of twenty-eighth branch sections, the sixteenth section, the plurality of thirty-first branch sections, and the plurality of twentieth branch sections make up a portion of the first electrode of the first capacitor; and the ninth section, the plurality of seventeenth branch sections, the plurality of eighteenth branch sections, the thirteenth section, the plurality of twenty-fifth branch sections, the plurality of twenty-sixth branch sections, the eleventh section, the plurality of twenty-first branch sections, the plurality of twenty-second branch sections, the fifteenth section, the plurality of twenty-ninth branch sections, and the plurality of thirtieth branch sections make up a portion of the common second electrode of the first capacitor and the second capacitor.

7. The semiconductor capacitor structure of claim 2, wherein a shape formed by the plurality of seventeenth branch sections, the plurality of nineteenth branch sections, the plurality of twenty-first branch sections, the plurality of twenty-third branch sections, the plurality of twenty-fifth branch sections, the plurality of twenty-seventh branch sections, the plurality of twenty-ninth branch sections, and the plurality of thirty-second branch sections comprises a circle or a polygon having even sides; and a shape formed by the plurality of eighteenth branch sections, the plurality of twentieth branch sections, the plurality of twenty-second branch sections, the plurality of twenty-fourth branch sections, the plurality of twenty-sixth branch sections, the plurality of twenty-eighth branch sections, and the plurality of thirtieth branch sections comprises a circle or a polygon having even sides.

8. The semiconductor capacitor structure of claim 2, wherein there is a first included angle between the tenth section and the sixteenth section, and between the twelfth section and the fourteenth section; there is a second included angle between the tenth section and the twelfth section, and between the fourteenth section and the sixteenth section; and a capacitance value ratio between the first capacitor and the second capacitor is directly proportional to an angle value ratio between the first included angle and the second included angle.

9. The semiconductor capacitor structure of claim 2, wherein the tenth section, the twelfth section, the fourteenth section, and the sixteenth section are coupled to each other.

10. The semiconductor capacitor structure of claim 1, wherein a shape formed by the plurality of first branch sections, the plurality of third branch sections, the plurality of fifth branch sections, the plurality of seventh branch sections, the plurality of ninth branch sections, the plurality of eleventh branch sections, the plurality of thirteenth branch sections, and the plurality of fifteenth branch sections comprises a circle or a polygon having even sides; and a shape formed by the plurality of second branch sections, the plurality of fourth branch sections, the plurality of sixth branch sections, the plurality of eighth branch sections, the plurality of tenth branch sections, the plurality of fourteenth branch sections, and the plurality of sixteenth branch sections comprises a circle or a polygon having even sides.

11. The semiconductor capacitor structure of claim 1, wherein there is a first included angle between the second section and the eighth section, and between the fourth section and the sixth section; there is a second included angle between the second section and the fourth section, and between the sixth section and the eighth section; and a capacitance value ratio between the first capacitor and the second capacitor is directly proportional to an angle value ratio between the first included angle and the second included angle.

12. The semiconductor capacitor structure of claim 1, wherein the second section, the fourth section, the sixth section, and the eighth section are coupled to each other.

13. A semiconductor capacitor structure composed of a first capacitor and a second capacitor, comprising:
a first metal layer, comprising:
a plurality of first branch sections parallel to one another in a radial direction with respect to a central point;
a plurality of second branch sections parallel to one another in a radial direction with respect to the central point;
a first section, coupled to the plurality of first branch sections and the plurality of second branch sections, wherein the first section extends from the central point in a radial direction to contact each of the branches of the first and second branch sections, wherein the branches of the first branch section extend from the first section in a first direction and the branches of the second branch section extend from the first section in a direction opposite the first direction;
a plurality of third branch sections parallel to one another;
a plurality of fourth branch sections parallel to one another, wherein the plurality of second branch sections interdigitate with each other in parallel, and the plurality of first branch sections and the plurality of fourth branch sections interdigitate with each other in parallel;
a second section, coupled to the plurality of third branch sections and the plurality of fourth branch sections, the second section having a first included angle;
a plurality of fifth branch sections parallel to one another;
a plurality of sixth branch sections parallel to one another;
a third section, coupled to the plurality of fifth branch sections and the plurality of sixth branch sections;
a plurality of seventh branch sections parallel to one another;
a plurality of eighth branch sections parallel to one another, wherein the plurality of sixth branch sections and the plurality of seventh branch sections interdigitate with each other in parallel, and the plurality of fifth branch sections and the plurality of eighth branch sections interdigitate with each other in parallel;
a fourth section, coupled to the plurality of seventh branch sections and the plurality of eighth branch sections, the fourth section having a second included angle;
a plurality of ninth branch sections parallel to one another;
a plurality of tenth branch sections parallel to one another;
a fifth section, coupled to the plurality of ninth branch sections and the plurality of tenth branch sections;
a plurality of eleventh branch sections parallel to one another;
a plurality of twelfth branch sections parallel to one another, wherein the plurality of tenth branch sections and the plurality of eleventh branch sections interdigitate with each other in parallel, and the plurality of ninth branch sections and the plurality of twelfth branch sections interdigitate with each other in parallel;
a sixth section, coupled to the plurality of eleventh branch sections and the plurality of twelfth branch sections, the sixth section having a third included angle;
a plurality of thirteenth branch sections parallel to one another;
a plurality of fourteenth branch sections parallel to one another;
a seventh section, coupled to the plurality of thirteenth branch sections and the plurality of fourteenth branch sections;
a plurality of fifteenth branch sections parallel to one another;
a plurality of sixteenth branch sections parallel to one another, wherein the plurality of fourteenth branch sections and the plurality of fifteenth branch sections interdigitate with each other in parallel, and the plurality of thirteenth branch sections and the plurality of sixteenth branch sections interdigitate with each other in parallel; and
an eighth section, coupled to the plurality of fifteenth branch sections and the plurality of sixteenth branch sections, the eighth section having a fourth included angle;
wherein the first section, the plurality of first branch sections, the plurality of second branch sections, the fifth section, the plurality of ninth branch sections, and the plurality of tenth branch sections make up a portion of a first electrode of the first capacitor; the second section, the plurality of third branch sections, the plurality of fourth branch sections, the sixth section, the plurality of eleventh branch sections, and the plurality of twelfth branch sections make up a portion of a second electrode of the first capacitor; the third section, the plurality of fifth branch sections, the plurality of sixth branch sections, the seventh section, the plurality of thirteenth branch sections, the plurality of fourteenth branch sections make up a portion of a first electrode of the second capacitor; and the fourth section, the plurality of seventh branch sections, the plurality of eighth branch sections, the eighth section, the plurality of fifteenth branch sections, and the plurality of sixteenth branch sections make up a portion of a second electrode of the second capacitor.

14. The semiconductor capacitor structure of claim 13, further comprising:
a second metal layer, comprising:
a plurality of seventeenth branch sections parallel to one another;
a plurality of eighteenth branch sections parallel to one another;
a ninth section, coupled to the plurality of seventeenth branch sections and the plurality of eighteenth branch sections;
a plurality of nineteenth branch sections parallel to one another;
a plurality of twentieth branch sections parallel to one another, wherein the plurality of eighteenth branch sections and the plurality of nineteenth branch sections interdigitate with each other in parallel, and the plurality of seventeenth branch sections and the plurality of twentieth branch sections interdigitate with each other in parallel;
a tenth section, coupled to the plurality of nineteenth branch sections and the plurality of twentieth branch sections, the tenth section having the first included angle;
a plurality of twenty-first branch sections parallel to one another;
a plurality of twenty-second branch sections parallel to one another;
an eleventh section, coupled to the plurality of twenty-first branch sections and the plurality of twenty-second branch sections;
a plurality of twenty-third branch sections parallel to one another;
a plurality of twenty-fourth branch sections parallel to one another, wherein the plurality of twenty-second branch sections and the plurality of twenty-third branch sections interdigitate with each other in parallel, and the plurality of twenty-first branch sections and the plurality of twenty-fourth branch sections interdigitate with each other in parallel;
a twelfth section, coupled to the plurality of twenty-third branch sections and the plurality of twenty-fourth branch sections, the twelfth section having the second included angle;
a plurality of twenty-fifth branch sections parallel to one another;
a plurality of twenty-sixth branch sections parallel to one another;
a thirteenth section, coupled to the plurality of twenty-fifth branch sections and the plurality of twenty-sixth branch sections;
a plurality of twenty-seventh branch sections parallel to one another;
a plurality of twenty-eighth branch sections parallel to one another, wherein the plurality of twenty-sixth branch sections and the plurality of twenty-seventh branch sections interdigitate with each other in parallel, and the plurality of twenty-fifth branch sections and the plurality of twenty-eighth branch sections interdigitate with each other in parallel;

a fourteenth section, coupled to the plurality of twenty-seventh branch sections and the plurality of twenty-eighth branch sections, the fourteenth section having the third included angle;
a plurality of twenty-ninth branch sections parallel to one another;
a plurality of thirtieth branch sections parallel to one another;
a fifteenth section, coupled to the plurality of twenty-ninth branch sections and the plurality of thirtieth branch sections;
a plurality of thirty-first branch sections parallel to one another;
a plurality of thirty-second branch sections parallel to one another, wherein the plurality of thirtieth branch sections and the plurality of thirty-first branch sections interdigitate with each other in parallel, and the plurality of twenty-ninth branch sections and the plurality of thirty-second branch sections interdigitate with each other in parallel; and
a sixteenth section, coupled to the plurality of thirty-first branch sections and the plurality of thirty-second branch sections, the sixteenth section having the fourth included angle; and
a dielectric layer, formed between the first metal layer and the second metal layer;
wherein the ninth section, the plurality of seventeenth branch sections, the plurality of eighteenth branch sections, the thirteenth section, the plurality of twenty-fifth branch sections, and the plurality of twenty-sixth branch sections respectively coincide in the vertical plane with the first section, the plurality of first branch sections, the plurality of second branch sections, the fifth section, the plurality of ninth branch sections, and the plurality of tenth branch sections; the tenth section, the plurality of nineteenth branch sections, the plurality of twenty-fourth branch sections, the fourteenth section, the plurality of twenty-seventh branch sections, and the plurality of twenty-eighth branch sections respectively coincide in the vertical plane with the second section, the plurality of third branch sections, the plurality of fourth branch sections, the sixth section, the plurality of eleventh branch sections, and the plurality of twelfth branch sections; the eleventh section, the plurality of twenty-first branch sections, the plurality of twenty-second branch sections, the fifteenth section, the plurality of twenty-ninth branch sections, and the plurality of thirtieth branch sections respectively coincide in the vertical plane with the third section, the plurality of fifth branch sections, the plurality of sixth branch sections, the seventh section, the plurality of thirteenth branch sections, and the plurality of fourteenth branch sections; and the twelfth section, the plurality of twenty-third branch sections, the plurality of twenty-fourth branch sections, the sixteenth section, the plurality of thirty-first branch sections, and the plurality of thirty-second branch sections respectively coincide in the vertical plane with the fourth section, the plurality of seventh branch sections, the plurality of eighth branch sections, the eighth section, the plurality of fifteenth branch sections, and the plurality of sixteenth branch sections.

15. The semiconductor capacitor structure of claim 14, wherein the ninth section, the plurality of seventeenth branch sections, the plurality of eighteenth branch sections, the thirteenth section, the plurality of twenty-fifth branch sections, and the plurality of twenty-sixth branch sections make up a portion of the first electrode of the first capacitor; the tenth section, the plurality of nineteenth branch sections, the plurality of twentieth branch sections, the fourteenth section, the plurality of twenty-seventh branch sections, and the plurality of twenty-eighth branch sections make up a portion of the second electrode of the first capacitor; the eleventh section, the plurality of twenty-first branch sections, the plurality of twenty-second branch sections, the fifteenth section, the plurality of twenty-ninth branch sections, and the plurality of thirtieth branch sections make up a portion of the first electrode of the second capacitor; and the twelfth section, the plurality of twenty-third branch sections, the plurality of twenty-fourth branch sections, the sixteenth section, the plurality of thirty-first branch sections, and the plurality of thirty-second branch sections make up a portion of the second electrode of the second capacitor.

16. The semiconductor capacitor structure of claim 14, wherein the ninth section, the plurality of seventeenth branch sections, the plurality of eighteenth branch sections, the thirteenth section, the plurality of twenty-fifth branch sections, and the plurality of twenty-sixth branch sections make up a portion of the second electrode of the first capacitor; the tenth section, the plurality of nineteenth branch sections, the plurality of twentieth branch sections, the fourteenth section, the plurality of twenty-seventh branch sections, and the plurality of twenty-eighth branch sections make up a portion of the first electrode of the first capacitor; the eleventh section, the plurality of twenty-first branch sections, the plurality of twenty-second branch sections, the fifteenth section, the plurality of twenty-ninth branch sections, and the plurality of thirtieth branch sections make up a portion of the second electrode of the second capacitor; and the twelfth section, the plurality of twenty-third branch sections, the plurality of twenty-fourth branch sections, the sixteenth section, the plurality of thirty-first branch sections, and the plurality of thirty-second branch sections make up a portion of the first electrode of the second capacitor.

17. The semiconductor capacitor structure of claim 14, wherein a shape formed by the plurality of seventeenth branch sections, the plurality of nineteenth branch sections, the plurality of twenty-first branch sections, the plurality of twenty-third branch sections, the plurality of twenty-fifth branch sections, the plurality of twenty-seventh branch sections, the plurality of twenty-ninth branch sections, and the plurality of thirty-second branch sections comprises a circle or a polygon having even sides; and a shape formed by the plurality of eighteenth branch sections, the plurality of twentieth branch sections, the plurality of twenty-second branch sections, the plurality of twenty-fourth branch sections, the plurality of twenty-sixth branch sections, the plurality of twenty-eighth branch sections, and the plurality of thirtieth branch sections comprises a circle or a polygon having even sides.

18. The semiconductor capacitor structure of claim 14, wherein the first included angle is equal to the third included angle, the second included angle is equal to the fourth included angle, and a capacitance value ratio between the first capacitor and the second capacitor is directly proportional to an angle value ratio between the first included angle and the second included angle.

19. The semiconductor capacitor structure of claim 13, wherein a shape formed by the plurality of first branch sections, the plurality of third branch sections, the plurality of fifth branch sections, the plurality of seventh branch sections, the plurality of ninth branch sections, the plurality of eleventh branch sections, the plurality of thirteenth branch sections, and the plurality of fifteenth branch sections comprises a circle or a polygon having even sides; and a shape formed by the plurality of second branch sections, the plurality of fourth branch sections, the plurality of sixth branch sections, the plurality of eighth branch sections, the plurality of tenth branch sections, the plurality of fourteenth branch sections, and the plurality of sixteenth branch sections comprises a circle or a polygon having even sides.

20. A semiconductor capacitor structure formed in at least a first metal layer, comprising a first capacitor and a second capacitor, the semiconductor capacitor structure in the first metal layer comprising:
  a plurality of first branch sections parallel to one another, making up a portion of a first electrode of the first capacitor;
  a plurality of second branch sections parallel to one another, making up a portion of the first electrode of the first capacitor;
  a plurality of third branch sections parallel to one another, interdigitating with the plurality of second branch sections in parallel to make up a portion of capacitance effect of the first capacitor;
  a plurality of fourth branch sections parallel to one another, interdigitating with the plurality of first branch sections in parallel to make up a portion of capacitance effect of the first capacitor;
  a plurality of fifth branch sections parallel to one another, making up a portion of a first electrode of the second capacitor;
  a plurality of sixth branch sections parallel to one another, making up a portion of the first electrode of the second capacitor;
  a plurality of seventh branch sections parallel to one another, interdigitating with the plurality of sixth branch sections in parallel to make up a portion of capacitance effect of the second capacitor;
  a plurality of eighth branch sections parallel to one another, interdigitating with the plurality of fifth branch sections in parallel to make up a portion of capacitance effect of the second capacitor;
  a plurality of ninth branch sections parallel to one another, making up a portion of the first electrode of the first capacitor;
  a plurality of tenth branch sections parallel to one another, making up a portion of the first electrode of the first capacitor;
  a plurality of eleventh branch sections parallel to one another, interdigitating with the plurality of tenth branch sections in parallel to make up a portion of capacitance effect of the first capacitor;
  a plurality of twelfth branch sections parallel to one another, interdigitating with the plurality of ninth branch sections in parallel to make up a portion of capacitance effect of the first capacitor;
  a plurality of thirteenth branch sections parallel to one another, making up a portion of the first electrode of the second capacitor;
  a plurality of fourteenth branch sections parallel to one another, making up a portion of the first electrode of the second capacitor;
  a plurality of fifteenth branch sections parallel to one another, interdigitating with the plurality of fourteenth branch sections in parallel to make up a portion of capacitance effect of the second capacitor;
  a plurality of sixteenth branch sections parallel to one another, interdigitating with the plurality of thirteenth branch sections in parallel to make up a portion of capacitance effect of the second capacitor;

wherein the plurality of first branch sections, the plurality of second branch sections, the plurality of third branch sections, the plurality of fourth branch sections, the plurality of fifth branch sections, the plurality of sixth branch sections, the plurality of seventh branch sections, the plurality of eighth branch sections, the plurality of ninth branch sections, the plurality of tenth branch sections, and the plurality of eleventh branch sections, the plurality of twelfth branch sections, the plurality of thirteenth branch sections, the plurality of fourteenth branch sections, the plurality of fifteenth branch sections, and the plurality of sixteenth branch sections are disposed along a plurality of closed contours parallel to one another.

21. The semiconductor capacitor structure of claim 20, also formed in a second metal layer, wherein a portion of the semiconductor capacitor structure in the second metal layer comprises a duplicate of the plurality of first branch sections, the plurality of second branch sections, the plurality of third branch sections, the plurality of fourth branch sections, the plurality of fifth branch sections, the plurality of sixth branch sections, the plurality of seventh branch sections, the plurality of eighth branch sections, the plurality of ninth branch sections, the plurality of tenth branch sections, the plurality of eleventh branch sections, the plurality of twelfth branch sections, the plurality of thirteenth branch sections, the plurality of fourteenth branch sections, the plurality of fifteenth branch sections, and the plurality of sixteenth branch sections of the semiconductor capacitor structure formed in the first metal layer.

22. The semiconductor capacitor structure of claim 21, wherein the duplicate of the semiconductor capacitor structure formed in the second metal layer coincide in the vertical plane with the plurality of first branch sections, the plurality of second branch sections, the plurality of third branch sections, the plurality of fourth branch sections, the plurality of fifth branch sections, the plurality of sixth branch sections, the plurality of seventh branch sections, the plurality of eighth branch sections, the plurality of ninth branch sections, the plurality of tenth branch sections, the plurality of eleventh branch sections, the plurality of twelfth branch sections, the plurality of thirteenth branch sections, the plurality of fourteenth branch sections, the plurality of fifteenth branch sections, and the plurality of sixteenth branch sections of the semiconductor capacitor structure formed in the first metal layer.

23. The semiconductor capacitor structure of claim 21, wherein the duplicate of the semiconductor capacitor structure formed in the second metal layer coincide in the vertical plane with the plurality of first branch sections, the plurality of second branch sections, the plurality of third branch sections, the plurality of fourth branch sections, the plurality of fifth branch sections, the plurality of sixth branch sections, the plurality of seventh branch sections, the plurality of eighth branch sections, the plurality of ninth branch sections, the plurality of tenth branch sections, the plurality of eleventh branch sections, the plurality of twelfth branch sections, the plurality of thirteenth branch sections, the plurality of fourteenth branch sections, the plurality of fifteenth branch sections, and the plurality of sixteenth branch sections of the semiconductor capacitor structure formed in the first metal layer after rotating 45 degrees.

24. The semiconductor capacitor structure of claim 20, in the first metal layer further comprising:
a first section, coupled to the plurality of first branch sections and the plurality of second branch sections, making up a portion of the first electrode of the first capacitor;
a third section, coupled to the plurality of fifth branch sections and the plurality of sixth branch sections, making up a portion of the first electrode of the second capacitor;
a fifth section, coupled to the plurality of ninth branch sections and the plurality of tenth branch sections, making up a portion of the first electrode of the first capacitor; and
a seventh section, coupled to the plurality of thirteenth branch sections and the plurality of fourteenth branch sections, making up a portion of the first electrode of the second capacitor.

25. The semiconductor capacitor structure of claim 20, in the first metal layer further comprising:
a second section, coupled to the plurality of third branch sections and the plurality of eighth branch sections;
a fourth section, coupled to the plurality of seventh branch sections and the plurality of twelfth branch sections;
a sixth section, coupled to the plurality of eleventh branch sections and the plurality of sixteenth branch sections; and
an eighth section, coupled to the plurality of fifteenth branch sections and the plurality of fourth branch sections;
wherein the second section, the fourth section, the sixth section, and the eighth section are coupled to each other at a same position, the second section, the fourth section, the sixth section, the eighth section, the plurality of third branch sections, the plurality of fourth branch sections, the plurality of seventh branch sections, the plurality of eighth branch sections, the plurality of eleventh branch sections, the plurality of twelfth branch sections, the plurality of fifteenth branch sections, and the plurality of sixteenth branch sections make up a portion of a common electrode of the first capacitor and the second capacitor.

26. The semiconductor capacitor structure of claim 25, wherein the second section and the sixth section are disposed along a first axis, the fourth section and the eighth section are disposed along a second axis, the first axis and the second axis form a first included angle and a second included angle, and a capacitance value ratio between the first capacitor and the second capacitor is substantially equal to an angle value ratio between the first included angle and the second included angle.

27. The semiconductor capacitor structure of claim 20, in the first metal layer further comprising:
a first sub-sub-section, coupled to the plurality of third branch sections;
a second sub-section, coupled to the plurality of eighth branch sections;
a third sub-section, coupled to the plurality of seventh branch sections;
a fourth sub-section, coupled to the plurality of twelfth branch sections;
a fifth sub-section, coupled to the plurality of eleventh branch sections;
a sixth sub-section, coupled to the plurality of sixteenth branch sections;
a seventh sub-section, coupled to the plurality of fifteenth branch sections; and
an eighth sub-section, coupled to the plurality of fourth branch sections;
wherein the eighth sub-section is coupled to the first sub-section, the second sub-section is coupled to the third sub-section, the fourth sub-section is coupled to the fifth sub-section, the sixth sub-section is coupled to the seventh sub-section, the first sub-section, the fourth sub-section, the fifth sub-section, the eighth sub-section, the plurality of third branch sections, the plurality of fourth branch sections, the plurality of eleventh branch sections, and the plurality of twelfth branch sections make up a portion of a second electrode of the first capacitor, and the second sub-section, the third sub-section, the sixth sub-section, the seventh sub-section, the plurality of seventh branch sections, the plurality of eighth branch sections, the plurality of fifteenth branch sections, and the plurality of sixteenth branch sections make up a portion of a second electrode of the second capacitor.

28. The semiconductor capacitor structure of claim 20, wherein the plurality of closed contours are a plurality of circular contours or a plurality of regular polygon contours.

* * * * *